US012702046B2

(12) United States Patent
Chang et al.

(10) Patent No.: US 12,702,046 B2
(45) Date of Patent: Aug. 4, 2026

(54) PACKAGE STRUCTURE AND METHOD FOR FABRICATING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Tzu-Hsuan Chang, Taipei City (TW); Chien-Liang Chen, New Taipei City (TW); Rong-Teng Lin, New Taipei City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 709 days.

(21) Appl. No.: 17/710,815

(22) Filed: Mar. 31, 2022

(65) Prior Publication Data

US 2023/0317535 A1 Oct. 5, 2023

(51) Int. Cl.
| | |
|---|---|
| *H10W 74/01* | (2026.01) |
| *B29C 45/14* | (2006.01) |
| *B29K 105/16* | (2006.01) |
| *B29K 401/00* | (2006.01) |
| *H10W 40/77* | (2026.01) |
| *H10W 74/10* | (2026.01) |
| *H10W 74/47* | (2026.01) |

(52) U.S. Cl.
CPC ......... *H10W 74/01* (2026.01); *H10W 40/778* (2026.01); *H10W 74/121* (2026.01); *H10W 74/473* (2026.01); *B29C 45/14* (2013.01); *B29K 2105/162* (2013.01); *B29K 2401/00* (2013.01)

(58) Field of Classification Search
CPC ....... H01L 23/295; H01L 21/56; B29C 45/14; B29C 45/0001; B29K 2105/162; B29K 2105/124; B29K 2507/04; B29K 2507/02; B29K 2401/00
See application file for complete search history.

(56) References Cited

U.S. PATENT DOCUMENTS

| | | | | |
|---|---|---|---|---|
| 6,590,292 B1* | 7/2003 | Barber | .................. | H01L 21/563 257/E23.101 |
| 2004/0262782 A1* | 12/2004 | Ellis | ...................... | H01L 21/563 257/E21.503 |

(Continued)

FOREIGN PATENT DOCUMENTS

| | | | | | |
|---|---|---|---|---|---|
| CN | 109616450 A | * | 4/2019 | ............... | C08K 3/28 |
| CN | 111423698 A | * | 7/2020 | ............ | B02C 17/10 |
| WO | WO-2016156853 A1 | * | 10/2016 | ........... | B23K 1/0016 |

OTHER PUBLICATIONS

Mechanical translation of Xue et al (CN 111423698 A) dated Jul. 2020. (Year: 2020).*

(Continued)

*Primary Examiner* — Jerzi H Moreno Hernandez
(74) *Attorney, Agent, or Firm* — Maschoff Brennan

(57) ABSTRACT

A method for fabricating a package structure is provided. The method includes premixing cellulose nanofibrils (CNFs) and a two-dimensional (2D) material in a solvent to form a solution; removing the solvent from the solution to form a composite filler; mixing a prepolymeric material with the composite filler to form a composite material; and performing a molding process using the composite material.

20 Claims, 25 Drawing Sheets

(56)                    References Cited

U.S. PATENT DOCUMENTS

| 2007/0045823 A1* | 3/2007 | Miller ................... H01L 23/295 |
| | | 257/706 |
| 2014/0175321 A1* | 6/2014 | Kim ...................... H01L 23/373 |
| | | 252/62 |
| 2014/0323512 A1* | 10/2014 | McKenna ............ A61K 9/1682 |
| | | 514/282 |
| 2017/0101571 A1* | 4/2017 | Fukushima ........... H01L 23/373 |
| 2017/0141007 A1* | 5/2017 | Hsieh ................... H01L 23/295 |
| 2017/0170095 A1* | 6/2017 | Matsubara .......... H01L 23/3733 |
| 2022/0002608 A1* | 1/2022 | Ebitani .............. H01L 23/3735 |
| 2022/0037229 A1* | 2/2022 | Chen ................... H01L 23/3128 |

OTHER PUBLICATIONS

Mechanical translation of Kang et al (CN 109616450 A) dated Apr. 2019. (Year: 2019).*

C. Pan et al., "Improved thermal conductivity and dielectric properties of hBN/PTFE composites via surface treatment by silane coupling agent", Composites Part B: Engineering, vol. 111, pp. 83-90, Feb. 2017.

P. Russo et al., "Thermal conductivity and dielectric properties of polypropylene-based hybrid compounds containing multiwalled carbon nanotubes", Journal of Applied Polymer Science, vol. 135, issue 28, p. 46470, Mar. 30, 2018.

J. Su et al., "Improvement of mechanical and dielectrical properties of ethylene propylene diene monomer (EPDM)/ parium titanate (BaTiO3) by layered mica and graphite flakes", Composites Part B: Engineering, vol. 112, pp. 148-157, Jan. 4, 2017.

G. Zhang et al, "Improved Through-Plane Thermal Conductivity and Mechanical Properties of Low-Dielectric FEP/HBN Composites by Adding PTFE Nanoparticles", ACS Applied Electronic Mater.2021, 3, 4568-4578, Oct. 14, 2021.

J. Su et al., "Remarkable enhancement of mechanical and dielectric properties of flexible ethylene propylene diene monomer (EPDM)/ barium titanate (BaTiO3) dielectric elastomer by chemical modification of particles", RSC Adv., Sep. 8, 2015, 5, 78448-78456.

* cited by examiner

M

S1 premixing cellulose nanofibrils and a thermally conductive 2D material to form a solution S2 filtering the solution S3 drying the solution to form a composite filler S4 compounding a prepolymeric material with the composite filler to form a composite material S5 performing an injection molding process with the composite material

130'

220C

MC

220

130

210

110'

120

210

130

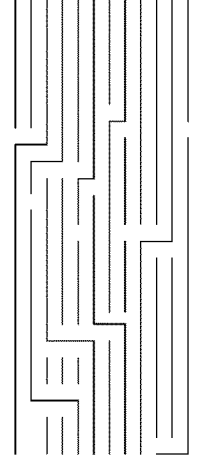
Fig. 5C
Fig. 5B
Fig. 5A
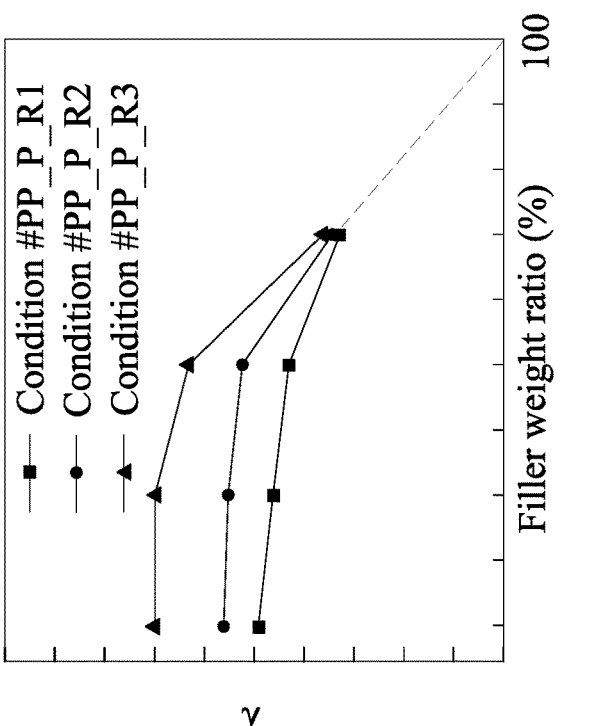
Fig. 5D

PACKAGE STRUCTURE AND METHOD FOR FABRICATING THE SAME

BACKGROUND

Semiconductor devices are used in a variety of electronic applications, such as personal computers, cell phones, digital cameras, and other electronic equipment, as examples. Semiconductor devices are fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These denser and smaller electronic components require more advanced packaging systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5C schematically illustrate thermally conductive paths in composite materials with different premixing weight ratios of CNF/h-BN according to some embodiments of the present disclosure.

FIG. 5D is a graph illustrating $\lambda$ versus filler weight ratio in PP according to some embodiments of the present disclosure.

DETAILED DESCRIPTION

Figure 1:
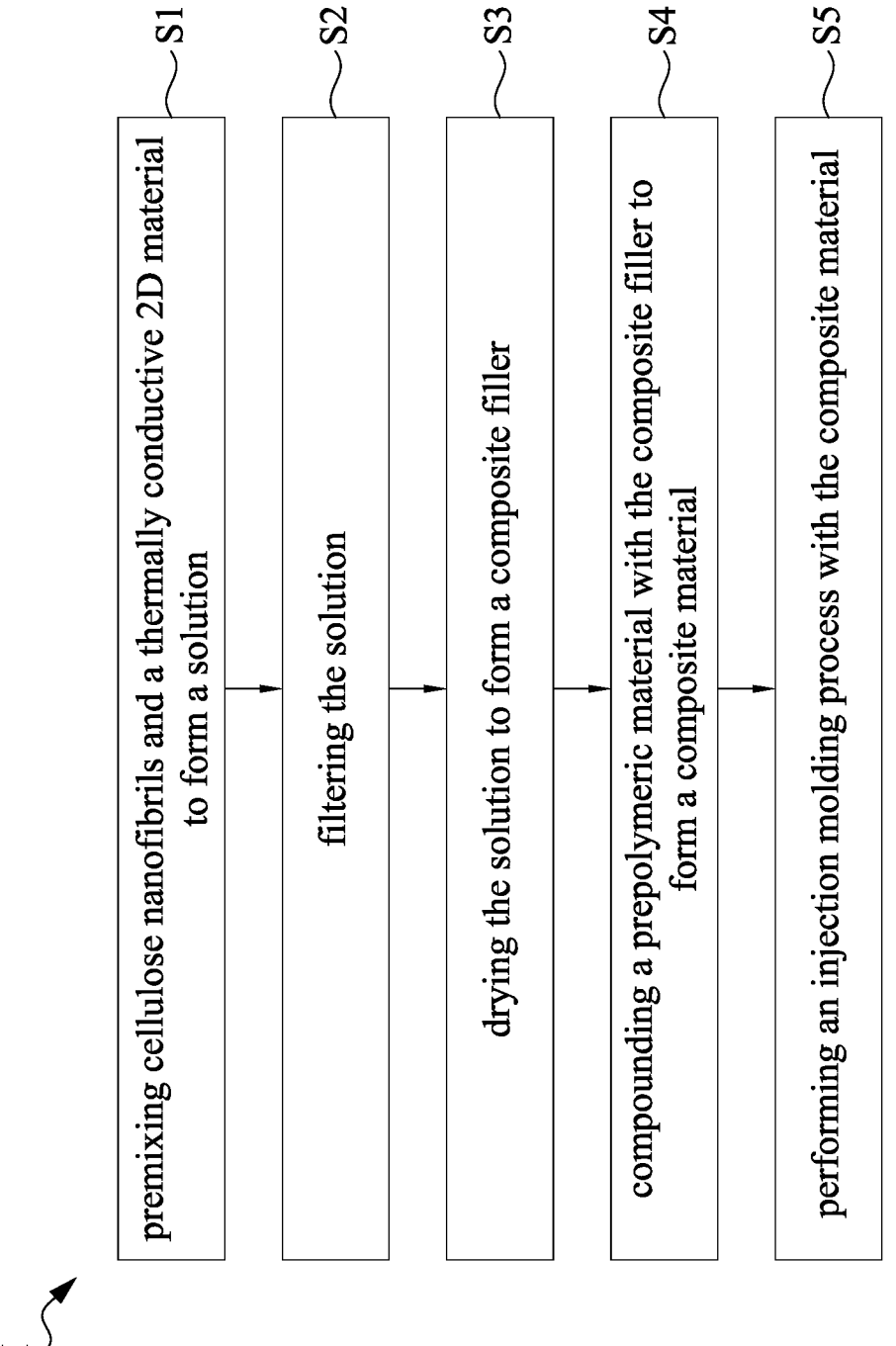
FIG. 1 is a flow chart of a method for forming a composite material in a package structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the power density per unit area of the chips increased towards the three-dimensional (3D) applications, high thermal conductive epoxy molding compound (EMC) material is introduced to package dies for heat management. EMC material may be blended with 2D materials to reinforce its thermal properties. The 2D material shows promising planar thermal conductive properties and their planar nature make it possible to form long distance thermally conductive path. The disperse of the 2D materials inside the volume-filling material may be influenced by high surface energy of 2D materials and high viscosity of the volume-filling material. In some embodiments of the present disclosure, by introducing a premixing process and suitable component ratios, the EMC material can be reinforced by the 2D material to form a compact thermal network to improve the thermal properties of the EMC material for advanced IC packaging techniques.

FIG. 1 is a flow chart of a method M for forming a composite material in a package structure according to some embodiments of the present disclosure. FIGS. 2A-2F illustrate the method M for forming the composite material in the package structure at various intermediate stages of manufacture according to some embodiments of the present disclosure. The method M may include steps S1-S5. At step S1, cellulose nanofibrils (CNFs) and a thermally conductive two-dimensional (2D) material are premixed to form a solution. At step S2, the solution is filtered. At step S3, the solution is dried to form a composite filler. At step S4, a polymeric material is compounded with the composite filler to form a composite material. At step S5, an injection molding process is performed with the composite material. It is understood that additional steps may be provided before, during, and after the steps S1-S5 shown by FIG. 1, and some of the steps described below can be replaced or eliminated for additional embodiments of the method. The order of the operations/processes may be interchangeable.

Figure 2C:
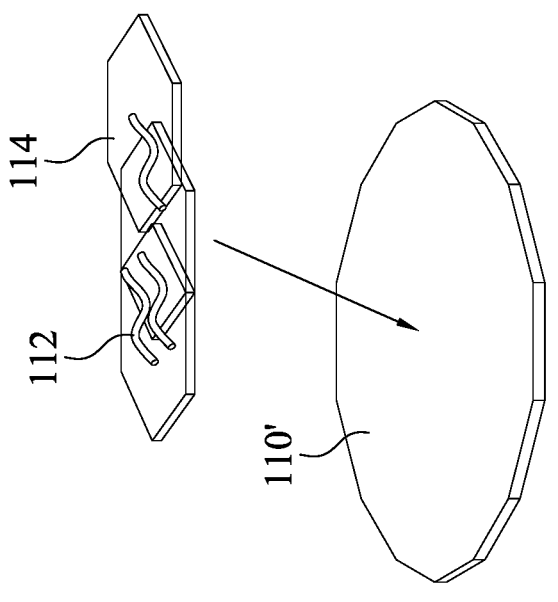
FIGS. 2A-2F illustrate a method for forming a composite material in a package structure at various intermediate stages of manufacture according to some embodiments of the present disclosure.
Figure 2B:
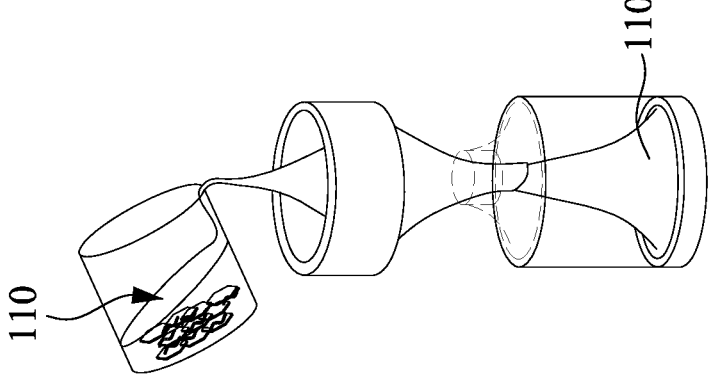
Figure 2A:
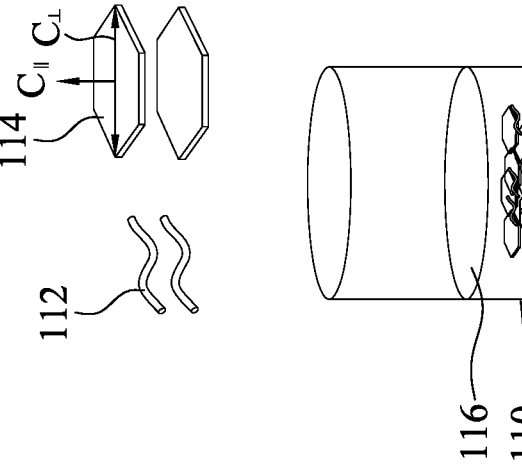

Reference is made to FIGS. 1 and 2A. The method M begins at step S1, where CNFs 112 and a thermally conductive 2D material 114 are premixed in a solvent 116. CNFs 112 may be natural or man-made 1D nanomaterials derived from celluloses that have a high length-to-width aspect ratio. For example, the CNFs 112 may include 1D nanostructures having an average length-to-width aspect ratio of at least 5:1. CNFs 112 may include for example: wood flour, wood fibers, sawdust, wood shavings, newsprint, paper, flax, hemp, grain hulls, kenaf, jute, sisal, nut shells or combinations thereof. In some other embodiments, other 1D nanomaterials or other nanofibrils having the high aspect ratio (e.g., carbon nanotubes and glass fibers) may also be applicable.

The thermally conductive 2D material 114 can be hexagonal boron nitride (h-BN), graphene, phosphorene, transition metal dichalcogenide (TMD), the like, or the combination thereof. The 2D material 114 is made of thin layers that may have a thickness of at least one atomic layer. Contrary to bulk materials, 2D material have a high surface-area-to-volume aspect ratio. For example, the 2D material 114 may include platelets (also referred to as flakes, nanosheets, or small flattened bodies) having a far smaller lateral dimension in a two-dimensional plane. In the present embodiments, the 2D material 114 may have a high thermal conductivity in its in-plane direction (e.g., the axis $C_{\parallel}$) and its out-of-plane direction (e.g., the axis $C_{\perp}$). In some embodiments, the 2D material 114 may show anisotropic thermal properties. For example, the in-plane thermal conductivity of the 2D material 114 may be higher than the out-of-plane thermal conductivity of the 2D material 114. The 2D material 114 may also be referred to as 2D nanomaterial. In the context, "out-of-plane" may also be referred to as "through-plane."

The 2D material 114 can be an electrically insulator (e.g., h-BN) or an electrical conductor (e.g., graphene). Boron nitride (BN) is a wide band gap III-V compound with remarkable physical properties and chemical stability. H-BN is a lattice alternately arranged by boron and nitrogen atoms in a two-dimensional plane by hexagonal lattice formation, showing a honeycomb structure. The nitrogen atomic nucleus and the bottom atom are combined by a $sp^2$ orbital to form a σ bond, and the adjacent interlayers may be held together by weak van der Waals forces, as in graphite. The h-BN films can be peeled off from bulk BN crystals by micromechanical cleavage. Few-layer hexagonal BN has also been made by ultrasonication and high-energy electron beam irradiation of BN particles. Graphene includes honeycomb-dimensional crystals closed arranged in a two-dimensional plane by $sp^2$ hybridized carbon atoms, and the adjacent interlayers may be held together by weak van der Waals forces. Each interlayer carbon atom bonds with the surrounding carbon atoms by $sp^2$ hybridization, and contributes a π bond, to allow the electrons to move freely between the layers.

In some embodiments, the 1D nanomaterial may have one dimension (e.g., length) outside the nanoscale and other two dimensions in the nanoscale. The 2D nanomaterial may have two dimensions (e.g., length and width) outside the nanoscale and one dimension (e.g., thickness) in nanoscale. Thus, the 1D nanomaterial may have a higher length-to-width ratio than the 2D nanomaterial. For example, the 1D nanomaterial may have a length-to-width aspect ratio greater than 5, and the 2D nanomaterial may have a length-to-width aspect ratio in a range from 0.01 to 5.

The solvent 116 may include any suitable liquid capable of suspending the CNFs 112 and the platelets of the 2D material 114. For example, the solvent 116 can include deionized water, isopropanol, the like, or the combination thereof. In illustrated embodiments, the premixing process includes a solution mixing step. After the premixing process, the CNFs 112, the 2D material 114, and the solvent 116 in combination may be referred to a solution 110.

Reference is made to FIGS. 1 and 2B. The method M proceeds to step S2, where the solution 110 including the CNFs 112 and the 2D material 114 may be filtered. By the filtration process, nanoparticles with different sizes are separated from the solution 110.

Reference is made to FIGS. 1 and 2C. The method M proceeds to step S3, where the filtered solution 110 (referring to FIG. 2B) is dried to form a composite filler 110'. The drying may involve evaporation of solvent 116 (referring to FIG. 2A). By the drying, the solvent 116 (referring to FIG. 2A) is removed from the filtered solution 110 (referring to FIG. 2B), thereby form the solid composite filler 110'. The composite filler 110' may be a composite film including the CNFs 112 and the 2D material 114.

Figure 2F:
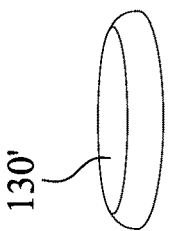
Figure 2E:
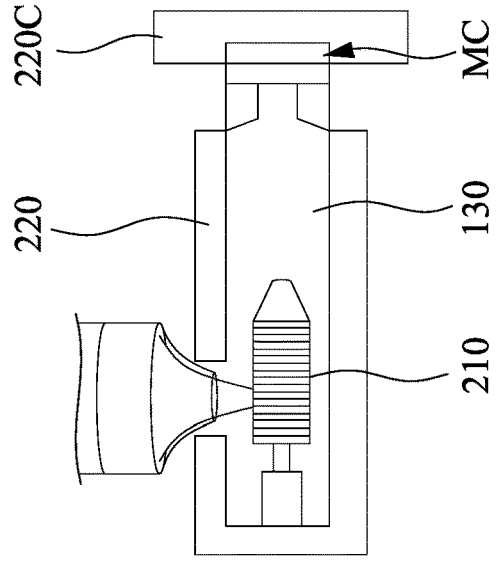
Figure 2D:
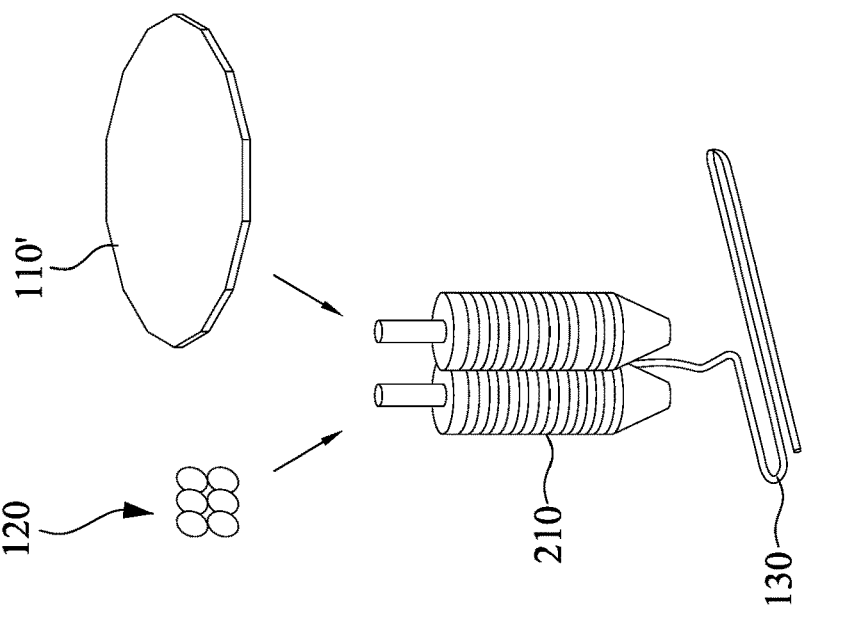

Reference is made to FIGS. 1 and 2D. The method M proceeds to step S4, where a prepolymeric material 120 is compounded with the composite filler 110' to form a composite material 130. The prepolymeric material 120 may include any prepolymer capable of serving as a molding compound, such as an epoxy, a resin, a moldable polymer, or the like. For example, the prepolymeric material 120 may include prepolymers of polypropylene (PP), polycarbonate, polyamide, polyethylene, or thermoplastic elastomer (TPE) or rubbers (e.g., thermoplastic polyurethane (TPU), thermoplastic polyolefin (TPO), and thermoplastic vulcanizate (TPV)). The prepolymer may include mixtures of reactive polymers with un-reacted monomers, and the prepolymer is capable of further polymerization by reactive groups to a fully cured, high molecular weight state. The prepolymeric material 120 may be applied while substantially liquid, and then may be cured through a chemical reaction, such as in an epoxy or resin. In other embodiments, the prepolymeric material 120 may be an ultraviolet (UV) or thermally curable prepolymer applied as a gel or malleable solid. In the context, the prepolymers and the prepolymeric material may also be referred to as a precursor or a polymeric precursor.

In some embodiments, in the compounding process, the prepolymeric material 120 and the composite filler 110' were first pulverized (i.e., broken into pieces) and then mixed by a melt-mixing step. In some embodiments, in melt-mixing step, the prepolymeric material 120 is melt, and the pulverized composite filler 110' possesses little or no viscoelastic characteristics is suspended in the melted prepolymeric material 120, thereby mixing the prepolymeric material 120 and the pulverized composite filler 110'. The mixture may then be melt-kneaded to form the composite material 130, for example, by use of a twin-screw compounder/extruder 210. In the illustrated embodiments, the compounding process may be a rotary compounding process using a rotary compounding machine including the twin-screw compounder/extruder 210. In some other embodiments, the prepolymeric material 120 and the composite filler 110' can be mixed by other compounding processes.

Reference is made to FIGS. 1 and 2E. The method M proceeds to step S5, where an injection molding process is performed with the composite material 130. In some embodiments, the composite material 130 is injected to a molding cavity MC of a chip carrier 220C for specific shapes by the use of a molding machine 220. The molding machine 220 can be an injection molding machine in some embodiments. Then, a curing process can be performed to harden the composite material 130 through a chemical reaction. After being hardened, the composite material 130 may be referred to as a composite material 130' as shown in FIG. 2F. In some embodiments, the compounding machine and the molding machine used in the formation process of the composite material can be verified industry compatible.

Figure 3A:
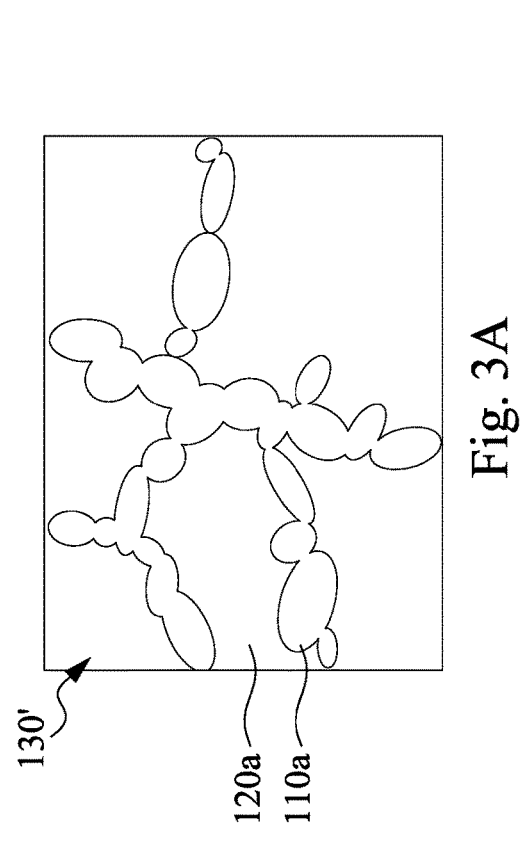
FIG. 3A is a schematic view of a composite material according to some embodiments of the present disclosure.
Figure 3B:
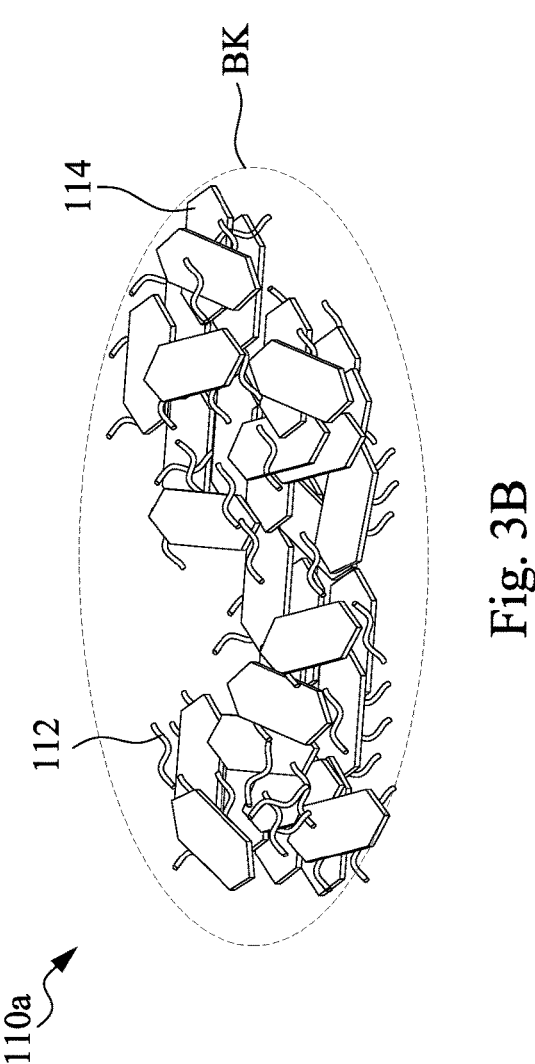
FIG. 3B is an enlarged schematic view of a network of the composite material of FIG. 3A.

FIG. 3A is a schematic view of a composite material 130' according to some embodiments of the present disclosure. FIG. 3B is an enlarged schematic view of the network 110a of the composite material 130' of FIG. 3A. Reference is made to FIGS. 3A and 3B. The composite material 130' may include a polymeric material 120a and a network 110a in the polymeric material 120a. The polymeric material 120a may include the same material as the prepolymeric material 120 (referring to FIG. 2D) does, and the network 110a may include the same material as the composite filler 110' (referring to FIG. 2C) does. The network 110a includes blocks BK of the CNFs 112 and platelets of the 2D material 114. In some embodiments of the present disclosure, the in-plane thermal conductivity of the 2D material 114 is higher than a thermal conductivity of the polymeric material 120a. In some further embodiments, the out-of-plane thermal conductivity of the 2D material 114 is higher than the thermal conductivity of the polymeric material 120a. Thus, the addition of the composite filler 110' (referring to FIG. 2C) is beneficial for increasing the thermal conductivity of the composite material 130'. The network 110a shows a continuous and long thermally conductive path in the composite material 130'. In the context, the thermally conductive path may also be referred to as a thermal dissipation path.

CNFs 112 may interact with the platelets of the 2D material, improve the homogeneous in-plane distribution (i.e., planar dispersion) of the platelets of the 2D material and make the platelets of the 2D material contact each other. In absence of the premixing process, in the compounding process, the CNFs and the platelets of the 2D material may be mixed and suspended in the polymeric material with low interaction, which forms short thermally conductive paths and a low thermal conductivity in the product.

In some embodiments of the present disclosure, by the premixing process, the interaction between the CNFs 112 and the platelets of the 2D material 114 is strengthened before the melt-mixing step of the compounding process. For example, by the premixing process with a suitable mixing ratio before the compound process, blocks BK of aggregated CNFs 112 and 2D material (e.g., h-BN) 114 are generated in the composite filler 110'. When melt-mixing the prepolymeric material 120 with the composite filler 110', the blocks BK of aggregated CNFs 112 and 2D material 114 can be effectively, uniformly, and homogeneously blended inside the prepolymeric material 120. The blocks BK may be contact with each other, and thus form a network (or a long path) 110a in the composite material 130' after the curing process. The blocks BK may contain a few flakes to tens/hundreds flakes of 2D materials in mostly plane stacking morphology. In some embodiments, the blocks BK may have a surface-to-volume aspect of at least 2:1 with respect to the unit thickness of the 2D materials. In some embodiments, the blocks BK are continuously connected to form the network 110a without any interruption. With the insertion of the network 110a, the good dispersion of 2D materials 114 can be realized. The thermally conductive properties of the 2D material 114 can be retained with the well-constructed inner network 110a. The thermally conductive network 110a may cause fast heat transfer in the composite material 130', which in turn may increase the thermal conductivity of the overall composite material 130'. With the increase of the thermal conductivity of the composite material 130' reinforced by 2D materials, the packaging can assist the heat spreading and conducting from the thermal generation center of the compact 3D electronics.

Figure 4B:
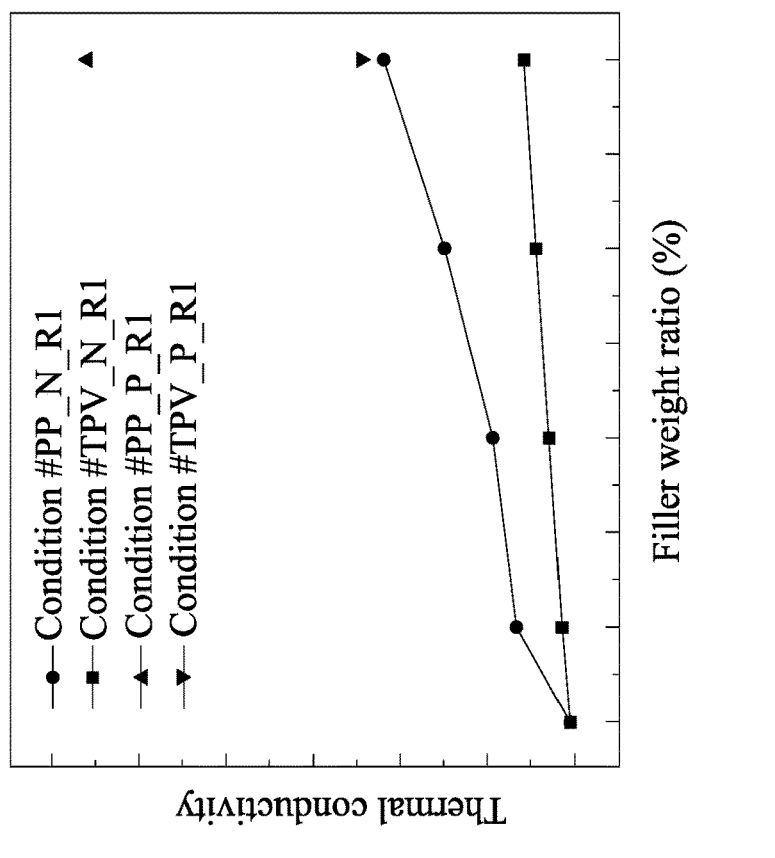
FIG. 4B is a graph illustrating thermal conductivity versus filler weight ratio of composite materials with various polymeric materials according to some embodiments of the present disclosure.
Figure 4A:
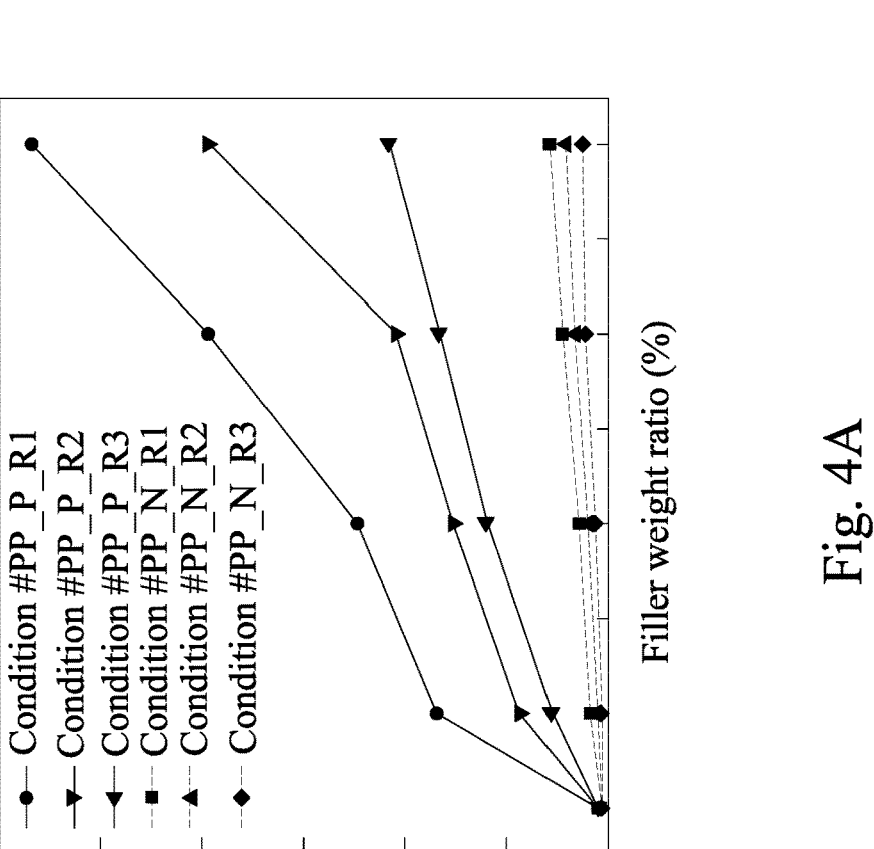
FIG. 4A is a graph illustrating thermal conductivity versus filler weight ratio of composite materials according to some embodiments of the present disclosure.

FIG. 4A is a graph illustrating thermal conductivity versus filler weight ratio of composite materials according to some embodiments of the present disclosure. In FIG. 4A, the filler weight ratio in polypropylene (PP) is shown on the horizontal axis, and the thermal conductivity of the composite material 130' (referring to FIGS. 2F and 3A) is shown on the vertical axis. The filler weight ratio is referred to as a sum weight of the filler (e.g., the CNF and the h-BN) to a sum weight of the filler (e.g., the CNF and the h-BN) and the polymeric material (e.g., PP).

For the Conditions #PP_P_R1, #PP_P_R2, and #PP_P_R3, the CNF and the h-BN are premixed respectively in first, second, and third premixing weight ratios to form the composite filler 110' (referring to FIG. 2C), and then the composite filler 110' is mixed with the PP, being molded to form the composite material 130' (referring to FIG. 2F). The first, second, and third premixing weight ratios get increases in the sequence. In some embodiments, the first premixing weight ratio of CNF/h-BN may be in a range from 1/99 to 20/80. The second premixing weight ratio of CNF/h-BN may be in a range from 30/70 to 60/40. For example, the second premixing weight ratio of CNF/h-BN may be substantially equal to about 1 (i.e., 50/50). The third premixing weight ratio of CNF/h-BN may be in a range from 65/35 to 80/20. For Conditions #PP_N_R1, #PP_N_R2, and #PP_N_R3, the CNFs, the h-BN, and the PP are mixed and molded to form the composite materials without performing the premixing process, in which the CNF and the h-BN are respectively mixed in first, second, and third mixing weight ratios, which are respectively equal to the first, second, and third premixing weight ratios.

As the graph shows, in Conditions #PP_P_R1, #PP_P_R2, or #PP_P_R3, the thermal conductivity of the composite material increases as the filler weight ratio increases. As a higher percentage of PP (i.e., a lower filler weight ratio) can improve the mechanical property of the composite material, a tradeoff may exist between thermal conductivity and mechanical property. For example, for a filler comprising CNFs and h-BN in PP, a filler weight ratio may be in a range from about 10% to about 80%. If the filler weight ratio is less than about 10%, the composite material may have poor thermal conductivity. If the filler weight ratio is greater than about 80%, the composite material may have poor mechanical property. In another examples, for a filler comprising CNFs and graphene in PP, a filler weight ratio may be in a range from about 10% to about 85%. If the filler weight ratio is less than about 10%, the composite material may have poor thermal conductivity. If the filler weight ratio is greater than about 85%, the composite material may have poor mechanical property.

Comparing Conditions #PP_P_R1, #PP_P_R2, and #PP_P_R3 with Conditions #PP_N_R1, #PP_N_R2, and #PP_N_R3, it can be observed that the premixing process causes an overall increase in the thermal conductivity.

In Conditions #PP_P_R1, #PP_P_R2, and #PP_P_R3, the thermal conductivity of the composite material increases as the premixing weight ratios of the CNF to the h-BN in the filler decreases. In some embodiments of the present disclosure, a premixing weight ratio of CNFs to 2D material (e. g., h-BN or graphene) may be in a range from about 10% to about 90%, where premixing weight ratios of the Conditions #PP_P_R1, #PP_P_R2, and #PP_P_R3 are included. If the premixing weight ratio is less than about 10%, the small amount of CNFs may not form the thermal conductive network in PP, which in turn may lower the thermal conductivity of the composite material. If the filler weight ratio is greater than about 90%, the small amount of the 2D material may lower the thermal conductivity of the CNF/h-BN network in PP, which in turn may lower the thermal conductivity of the composite material.

FIG. 4B is a graph illustrating thermal conductivity versus filler weight ratio of composite materials with various polymeric materials according to some embodiments of the present disclosure. In FIG. 4B, the filler weight ratio in a polymeric material is shown on the horizontal axis, and the thermal conductivity of the composite material 130' (referring to FIGS. 2F and 3A) is shown on the vertical axis. The filler weight ratio is referred to as a sum weight of the filler (e.g., the CNF and the h-BN) to a sum weight of the filler (e.g., the CNF and the h-BN) and the polymeric material.

In FIG. 4B, Conditions #PP_N_R1 and #PP_P_R1 have been illustrated as the above description of FIG. 4A. Condition #TPV_P_R1 is similar to Condition #PP_P_R1, except that Condition #TPV_P_R1 uses TPV as their polymeric material, not the PP used in the Condition #PP_P_R1. For example, for Condition #TPV_P_R1, the CNF and the h-BN are premixed by the aforementioned first premixing weight ratio to form the composite filler 110' (referring to FIG. 2C), and then the composite filler 110' (referring to FIG. 2C) is mixed with the TPV, being molded to form the composite material 130' (referring to FIG. 2F).

As the graph shows, the thermal conductivity of the composite material increases as the filler weight ratio increases. It is confirmed from FIG. 4B that a rubber-based composite material including the CNF, the h-BN, and the TPV can be fabricated with a fine thermal conductivity through the premixing process.

FIGS. 5A-5C schematically illustrate thermally conductive paths in composite materials with different premixing weight ratios of CNF/h-BN according to some embodiments of the present disclosure. In FIG. 5A, the CNF and the h-BN are premixed by the first premixing weight ratio as Condition #PP_P_R1 in FIG. 4A. In FIG. 5B, the CNF and the h-BN are premixed by the second premixing weight ratio as Condition #PP_P_R2 in FIG. 4A. In FIG. 5C, the CNF and the h-BN are premixed by the third premixing weight ratio as Condition #PP_P_R3 in FIG. 4A. The different premixing weight ratios of CNF/h-BN may result in different dispersions, which lead to different thermally conductive paths. In FIGS. 5A-5C, the thermally conductive paths are illustrated as including horizontal lines and vertical lines, in which the horizontal lines correspond to the platelets of the 2D material 114 closely arranged in the in-plane direction, and the vertical lines correspond to the platelets of the 2D material 114 vertically stacked along the out-of-plane direction.

For example, in FIGS. 5A-5C, decreasing the premixing weight ratios of CNF/h-BN may enlarge the thermally conductive paths in the in-plane direction. On the other hand, increasing the premixing weight ratios of CNF/h-BN may break the in-plane thermally conductive paths. As 2D material shows an anisotropic thermal property, it can be inferred that the thermal conductivity of the composite material can be increased by decreasing the premixing weight ratios of CNF/h-BN, which coincides with the result shown in FIG. 4A.

FIG. 5D is a graph illustrating $\lambda$ versus filler weight ratio in the PP according to some embodiments of the present disclosure. In FIG. 5D, the filler weight ratio in PP is shown on the horizontal axis, and $\lambda$ is shown on the vertical axis. In FIG. 5D, $\lambda$ is referred to as proportion of how many 2D materials are dispersed in planar/our-of-plan morphology. $\lambda$ may be used as an indicator of degrees of the in-plane distribution of the filler (CNF/h-BN) in the composite material. Since the platelet of 2D material has high aspect ratio and shows a highly anisotropic thermal property, the thermal conductivity of the h-BN filled composites would be strongly associated with the platelet orientation. In FIG. 5D, the less $\lambda$ indicates that the filler (CNF/h-BN) are more in-plane distributed, while the greater $\lambda$ indicates that the filler (CNF/h-BN) are more isotropically distributed. For example, by increasing the filler weight ratio to 100%, $\lambda$ is converged to theoretical zero, which indicates a CNF/h-BN film has a high degree of in-plane distribution. The high-degree in-plane distribution forms a continuous thermally conductive path, thereby enhancing the thermal conductivity of the composite material. Comparing Conditions #PP_P_R1, #PP_P_R2, and #PP_P_R3, the Condition #PP_P_R1 has greatest amount of h-BN and a least $\lambda$. Thus, it may be concluded inferred that by increasing the amount of the h-BN in the composite material, the thermal conductivity of the composite material may be increased.

From FIGS. 4A-5D, it may be concluded that when CNF/h-BN ratio is equal to or less than 1 (i.e., 50/50), planar dispersion of 2D materials inside the polymeric material can be optimized, and thus the composite material has good dispersion and good thermal conductivity.

Figure 6:
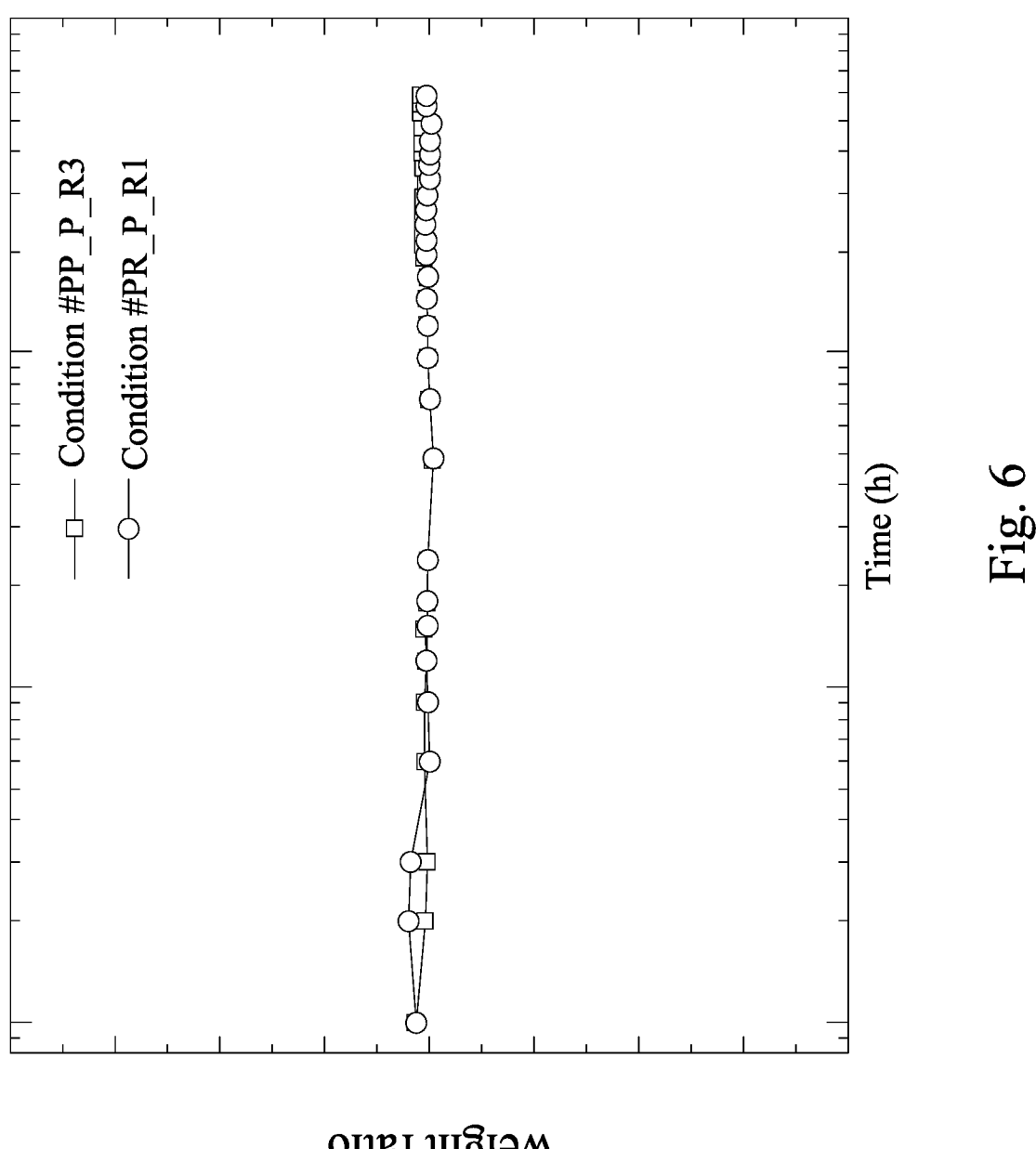
FIG. 6 shows water immersion test of composite materials with different premixing weight ratios of CNF/h-BN according to some embodiments of the present disclosure.

FIG. 6 shows water immersion test of composite materials with different premixing weight ratios of CNF/h-BN according to some embodiments of the present disclosure. In FIG. 6, time is shown on the horizontal axis, and a ratio of a weight of an immersed composite material to a weight of a non-immersed composite material is shown on the vertical axis. Conditions #PP_P_R1 and #PP_P_R3 have been illustrated as the above description of FIG. 4A.

As the graph shows, in the water immersion test, the composite material keeps substantially the same weight ratio as time passes. This indicates that the composite material fabricated through the premixing process has a strong resistance to moisture invasion. Comparing Condition #PP_P_R1 with Condition #PP_P_R3, it can be observed that the composite materials with different premixing weight ratios both have strong resistances to moisture invasion. This indicates that the composite materials with different premixing weight ratios both have good passivation properties, thereby being capable of preventing electronics from moisture/water-induced degradation.

Figure 7A:
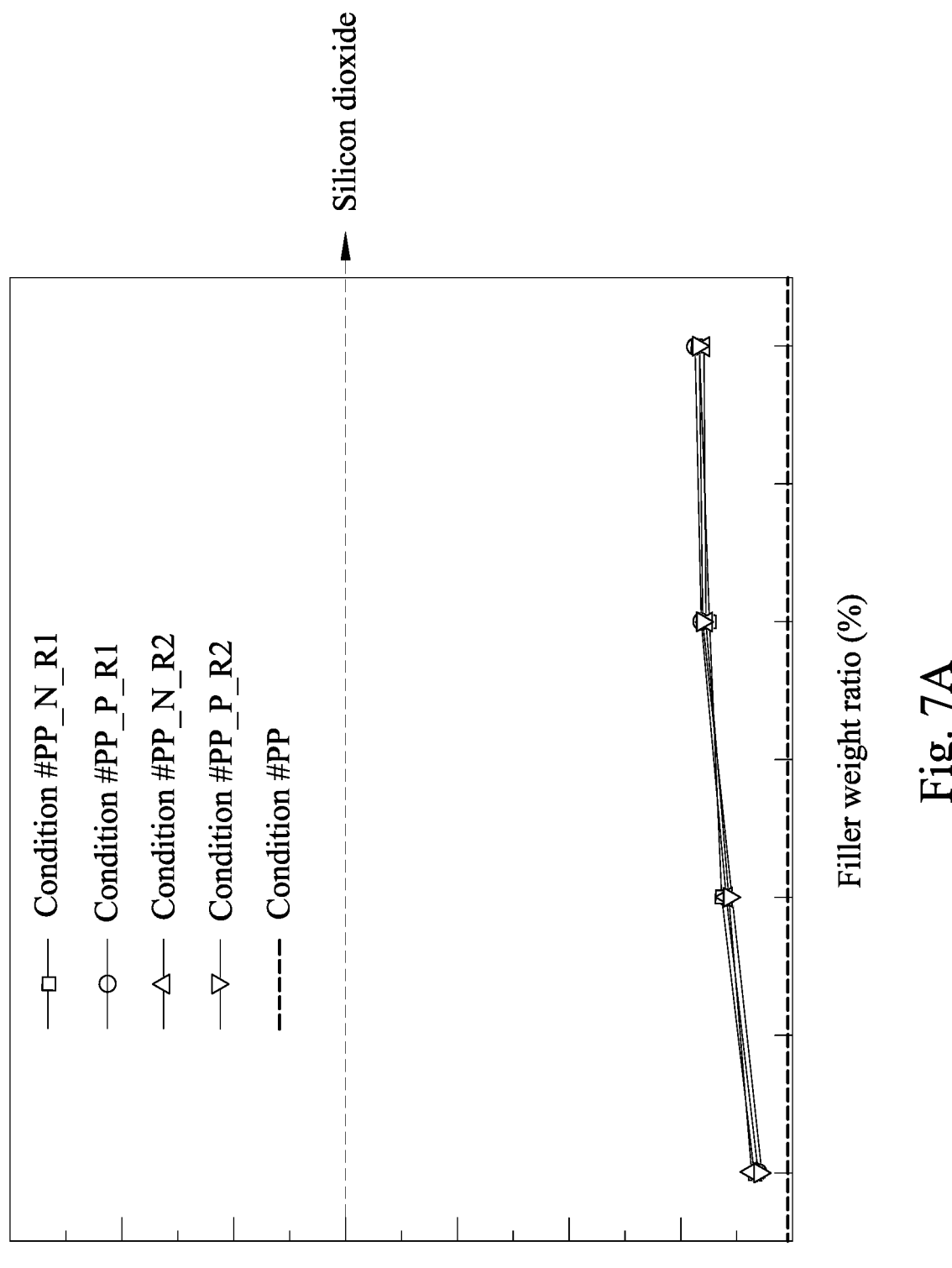
FIG. 7A is a graph illustrating dielectric constant versus filler weight ratio of composite materials with CNF/h-BN according to some embodiments of the present disclosure.

FIG. 7A is a graph illustrating dielectric constant versus filler weight ratio of composite materials with CNF/h-BN according to some embodiments of the present disclosure. In FIG. 7A, the filler weight ratio in PP is shown on the horizontal axis, and the dielectric constant of composite materials is shown on the vertical axis. Conditions #PP_N_R1, #PP_P_R1, #PP_N_R2, and #PP_P_R2 have been illustrated as the above description of FIG. 4A. For Conditions #PP, the composite material is a pure PP without the CNF or h-BN filler. In FIG. 7A, the dashed line indicates a dielectric constant of silicon dioxide.

As the graph shows, the dielectric constant of the composite material increases as the filler weight ratio increases. In FIG. 7A, comparing Condition #PP_N_R1, #PP_P_R1, #PP_N_R2, and #PP_P_R2 with Condition #PP, it can be observed that the addition of the CNF and h-BN filler increases the dielectric constants. Comparing Condition #PP_N_R1 and #PP_P_R1 with Conditions #PP_N_R2 and #PP_P_R2, it can be observed that composite materials with different CNF/h-BN weigh ratios have similar dielectric constants. Comparing Condition #PP_P_R1 and #PP_P_R2 with Conditions #PP_N_R1 and #PP_N_R2, it can be observed that the composite materials fabricated through the premixing process have dielectric constants similar that of the composite materials free of the premixing process. In FIG. 7A, the composite materials fabricated through the premixing process may have a dielectric constant lower than the dielectric constant of silicon dioxide, and thus can be referred to as low-k dielectrics. The dielectric constant of the composite materials may also be lower than a dielectric constant of the epoxy. The lower dielectric constant can result in a low capacitance between electrodes, thereby lowering crosstalk of dense-packed circuits, which in turn will reduce noise and increase device speed. In some embodiments, the composite materials fabricated through the premixing process may have a dielectric constant with a range varying with electric conductivity of filler.

Figure 7B:
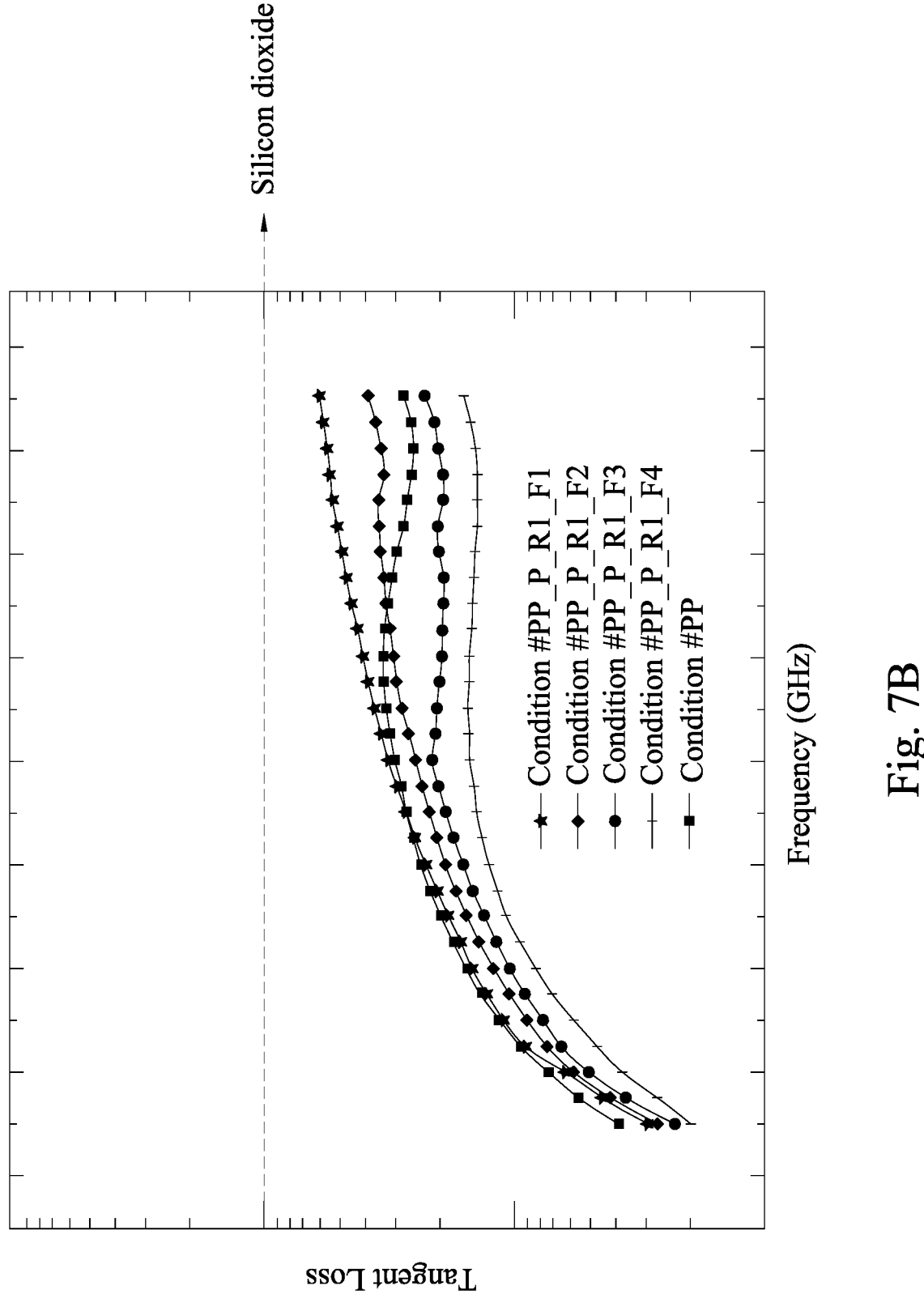
FIG. 7B is a graph illustrating dielectric tangent loss of composite materials with CNF/h-BN according to some embodiments of the present disclosure.

FIG. 7B is a graph illustrating dielectric tangent loss of composite materials with CNF/h-BN according to some embodiments of the present disclosure. In FIG. 7B, the frequency is shown on the horizontal axis, and the dielectric tangent loss of composite materials is shown on the vertical axis. Conditions #PP_P_R1_F1, #PP_P_R1_F2, #PP_P_R1_F3, and #PP_P_R1_F4 are similar as Conditions #PP_P_R1 illustrated in the above description of FIG. 4A, but further limit the filler weight ratios. For example, Conditions #PP_P_R1_F1, #PP_P_R1_F2, #PP_P_R1_F3, and #PP_P_R1_F4 are respectively prepared with first to fourth filler weight ratios, in which the first to fourth filler weight ratios increases in a sequence. Condition #PP has been illustrated as the above description of FIG. 7A. In FIG. 7A, the dashed line indicates a dielectric tangent loss of silicon dioxide.

It is evidenced by FIG. 7B that the tangent loss of the composite materials decreases with the increase of the filler weight ratio. This indicate that addition of the CNF/h-BN filler may suppress the tangent loss. This coincides with the result shown in FIG. 4A since tangent loss implies electrical energy dissipation during signal propagation. In FIG. 7B, the composite materials fabricated through the premixing process may have a low dielectric tangent loss. For example, the dielectric tangent loss of the composite materials fabricated through the premixing process are lower than a dielectric tangent loss of silicon dioxide, a dielectric tangent loss of cellulose fibril, and/or a dielectric tangent loss of silicon.

The low dielectric tangent loss can reduce noise and power loss, thereby making it a promising package material for high-speed computing.

Figure 8B:
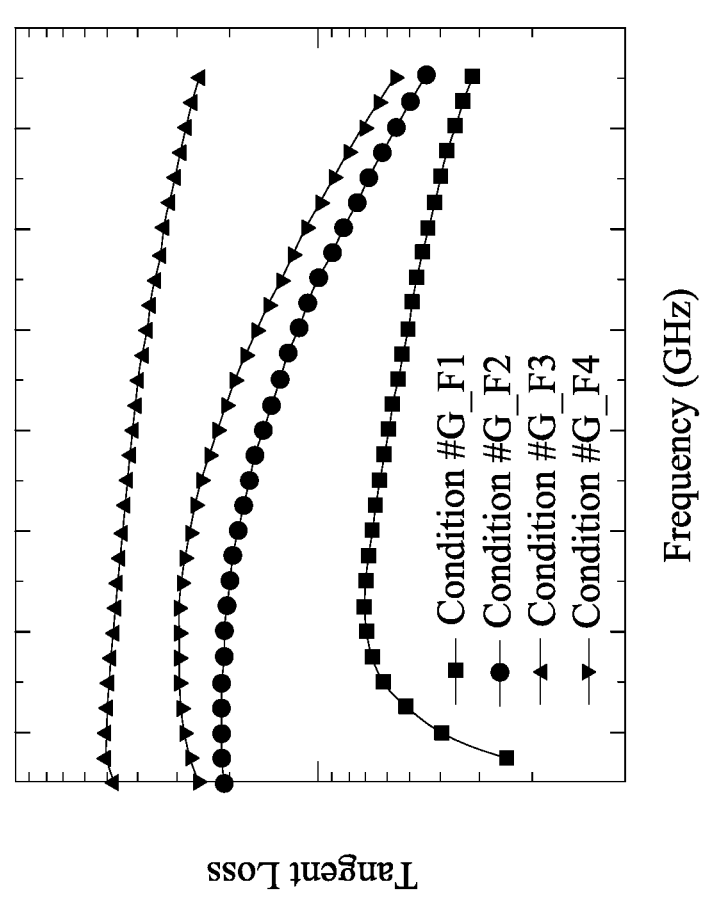
FIG. 8B is a graph illustrating dielectric tangent loss of composite materials according to some embodiments of the present disclosure.
Figure 8A:
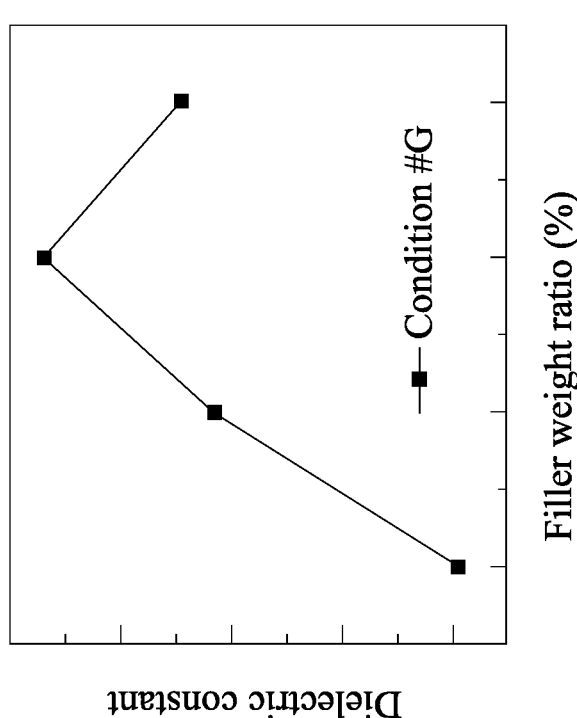
FIG. 8A is a graph illustrating dielectric constant versus filler weight ratio of a composite material with CNF/graphene according to some embodiments of the present disclosure.

FIG. 8A is a graph illustrating dielectric constant versus filler weight ratio of a composite material with CNF/graphene according to some embodiments of the present disclosure. FIG. 8B is a graph illustrating dielectric tangent loss of composite materials with CNF/h-BN according to some embodiments of the present disclosure. In embodiments of FIGS. 8A and 8B, the 2D material 114 (referring to FIG. 2A) is graphene. In FIG. 8A, the filler weight ratio in PP is shown on the horizontal axis, and the dielectric constant of composite materials is shown on the vertical axis. For Conditions #G, the CNF 112 and graphene 114 (referring to FIG. 2A) are premixed to form the composite filler 110' (referring to FIG. 2C), and then the composite filler 110' is mixed with the PP, being molded to form the composite material 130' (referring to FIG. 2F). It is evidence by FIG. 8A that the dielectric constant may have a greatest value at a determined filler weight ratio, and decreases when leaving the determined filler weight ratio. In some embodiments, a premixing weight ratio of CNF/graphene may determine the dispersion thereof, and it may affect the thermally conductive path as illustrated above in the embodiments of CNF/h-BN, and could also optimize the conductivity and resistance thereof.

In FIG. 8B, the frequency is shown on the horizontal axis, and the dielectric tangent loss of composite materials is shown on the vertical axis. Conditions #G_F1, #G_F2, #G_F3, and #G_F4 are similar as Conditions #G illustrated in the above description of FIG. 8A, but further limit the filler weight ratios. For example, Conditions #G_F1, #G_F2, #G_F3, and #G_F4 are respectively prepared with first to fourth filler weight ratios, in which the first to fourth filler weight ratios increases in a sequence. It is evidence by FIG. 8B that the dielectric constant may have a greatest value at a determined filler weight ratio (e.g., Condition #G_F3), and decreases when leaving the determined filler weight ratio. From FIGS. 8A and 8B, it may be concluded that, besides the premixing ratio of CNF/graphene, the filler weight ratio can optimize the dielectric constant and the dielectric tangent loss of the composite material. Therefore, by designing the composite material with a suitable filler weight ratio, the shielding effectiveness thereof can be improved, such that the composite material can provide protection against electrostatic discharge (ESD) and electromagnetic interference (EMI).

FIGS. 9A-9G illustrate a method for fabricating an integrated fan-out (InFO) package structure at various intermediate stages of manufacture according to some embodiments of the present disclosure. It is understood that additional steps may be provided before, during, and after the steps shown by FIGS. 9A-9G, and some of the steps described below can be replaced or eliminated for additional embodiments of the method. The order of the operations/processes may be interchangeable.

Figure 9A:
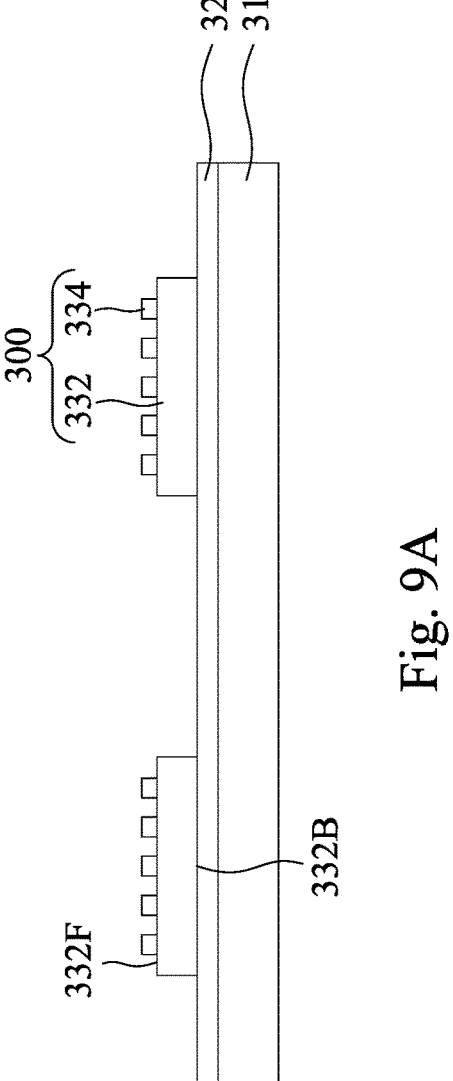
FIGS. 9A-9G illustrate a method for fabricating an integrated fan-out (InFO) package structure at various intermediate stages of manufacture according to some embodiments of the present disclosure.

FIG. 9A illustrates dies 330 attached to a carrier 310. The dies 330 may each include a main body 332 and a contact die pattern 334 on a front side 332F of the main body 332. In the illustrated embodiments, the dies 330 are faced-up attached on the carrier 310, such that the contact die pattern 334 are away from the carrier 310. The carrier 310 may be formed of quartz, glass, or the like, and provides mechanical support for subsequent processing steps. The carrier 310 may be substantially free of any active devices and/or functional circuitry.

The dies 330 may be attached to the carrier 310 using one or more adhesive layers 320 formed on back sides 332B of the main body 332 of the dies 330. The one or more adhesive layers 320 may comprise a die attach film, a de-bonding layer, any suitable adhesive, epoxy, wax, the like or the combination thereof, and may be formed using a deposition process, a spin coating process, a printing process, a lamination process, or the like. The de-bonding layer may be decomposable, for example, under the UV radiation or the heat of light, thereby release the carrier 310 from the dies 330. The de-bonding layer may be an ultraviolet (UV) glue (which loses its adhesive property when exposed to UV radiation), a light-to-heat conversion (LTHC) glue (which loses its adhesive property when exposed to light), the like, or other types of adhesives, for example.

In some embodiments, the dies 330 may be logic dies, memory dies, sensor dies, analog dies, or the like. The dies 330 may be formed using a complementary metal-oxide-semiconductor (CMOS) process, a micro-electro-mechanical systems (MEMS) process, a nano-electro-mechanical systems (NEMS) process, the like, or a combination thereof. In some embodiments, the dies may be formed as part of a wafer. The wafer is singulated by sawing, laser ablation, or the like, to form the individual dies 330. Subsequently, functional testing may be performed on the dies 330. The dies 330 illustrated in FIG. 9A may have passed one or more functional quality tests.

The main body 332 of the dies 330 may comprise a substrate, various active and passive devices on the substrate, and various metallization layers over the substrate. The substrate may be a semiconductor substrate, for example, a silicon substrate. The substrate may also be in the form of semiconductor-on-insulator (SOI). The SOI substrate may comprise a layer of a semiconductor material (e.g., silicon, germanium and/or the like) formed over an insulator layer (e.g., buried oxide and/or the like), which is formed on a semiconductor substrate. In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like. The metallization layers may include an inter-layer dielectric (ILD)/inter-metal dielectric layers (IMDs) formed over the substrate. The ILD/IMDs may be formed, for example, of a low-k dielectric material, such as phosphosilicate glass (PSG), borophosphosilicate glass (BPSG), fluorosilicate glass (FSG), $SiO_xC_y$, silicon carbon material, compounds thereof, composites thereof, combinations thereof, or the like, by any suitable method known in the art, such as spinning, chemical vapor deposition (CVD), and plasma enhanced CVD (PECVD). In some embodiments, interconnect structures may be formed in the ILD/IMDs using, for example, a damascene process, a dual damascene process, or the like. The ILD/IMDs may be patterned using photolithography techniques to form trenches and vias. The interconnect structures are formed by depositing a suitable conductive material in the trenches and the vias of the ILD/IMDs using various deposition and plating methods, or the like. A chemical-mechanical polishing (CMP) may then be performed to remove excess portions of the interconnect structures. In some embodiments, the interconnect structures may provide electrical connections between the various passive and active devices formed on the substrate.

The contact die pattern 334 may be formed over the metallization layers of the main body 332 and may be electrically coupled to the active devices through various interconnect structures of the metallization layers. The contact die pattern 334 may include one or more contact pad, contact studs, the like, or the combination thereof. In some embodiments, the contact die pattern 334 may comprise aluminum, although other conductive materials such as copper, tungsten, silver, gold, the like, or a combination thereof may also be used. In some embodiments, the conductive material of the contact die pattern 334, such as aluminum, is deposited over the metallization layers and patterned to form the contact die pattern 334. In some other embodiments, the contact die pattern 334 comprising copper may be formed using, for example, a damascene process.

Figure 9B:
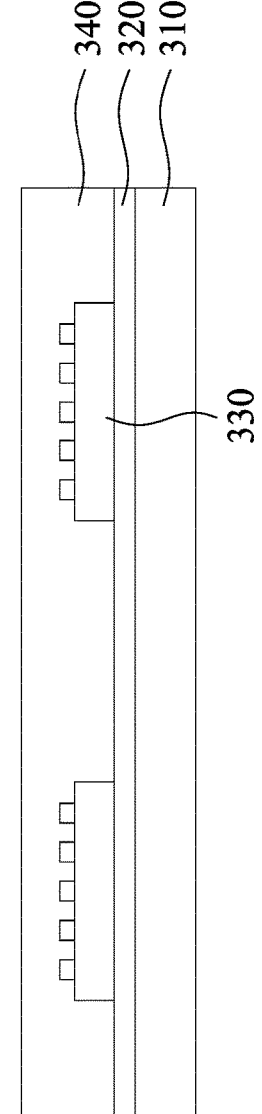

Referring to FIG. 9B, a molding process is performed to encapsulating the dies 330 with a first encapsulant 340. After the molding process, the first encapsulant 340 is formed over the carrier 310 and between neighboring dies 330. The first encapsulant 340 may include aforementioned composite material 130' (referring to FIGS. 2F-3B) fabricated through the premixing process. The first encapsulant 340 may provide thermal management and electrical insulation. For example, the first encapsulant 340 is formed by premixing CNFs and h-BN to form a composite filler, compounding a prepolymeric material with the composite filler, and curing the mixture.

Figure 9C:
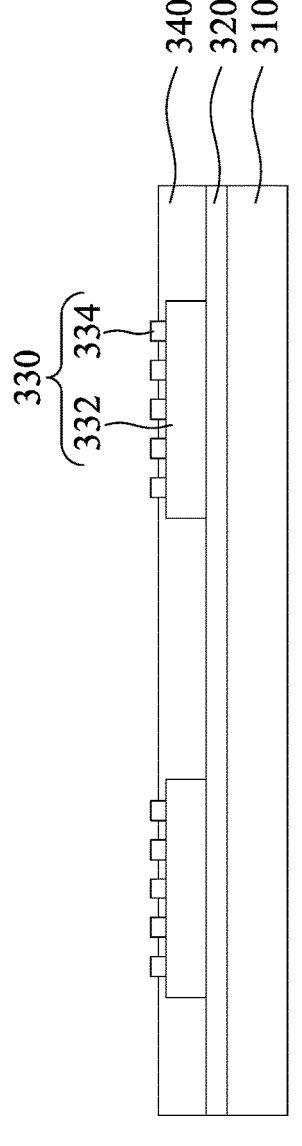

Referring to FIG. 9C, a top surface of the first encapsulant 340 is lowered to expose top portions of the contact die pattern 334. In some embodiments, portions of the first encapsulant 340 extending over the dies 330 may be removed to expose the contact die pattern 334 therein. The portions of the first encapsulant 340 may be removed using a CMP, a grinding process, an etch process, or another suitable thinning process. After the lowering process, top surfaces of the contact die pattern 334 may be level with or higher than the lowered top surface of the first encapsulant 340.

Figure 9D:
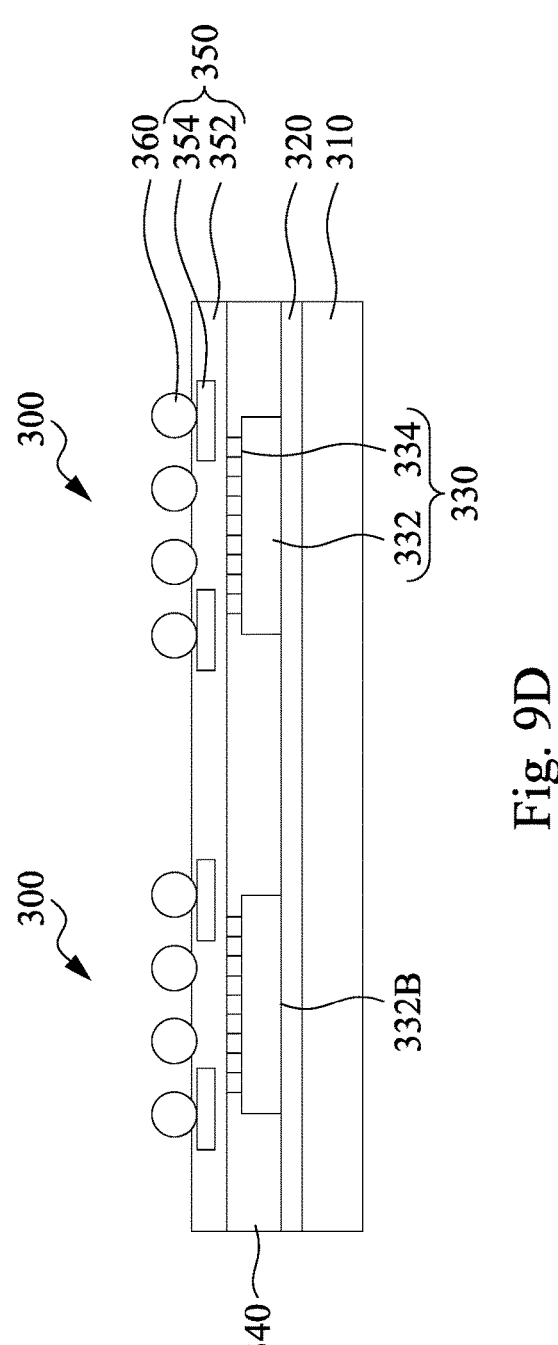

Referring to FIG. 9D, a redistribution layer RDL 350 is formed over the dies 330 and the first encapsulant 340. In some embodiments, the RDL 350 comprises one or more dielectric layers 352 and one or more conductive features 354 disposed within the one or more dielectric layers 352. The one or more dielectric layers 352 may comprise dielectric materials such as polyimide, benzocyclobutene (BCB), polybenzoxazole (PBO), the like, or a combination thereof, and may be formed using a spin-on coating process, or the like. Each of the one or more dielectric layers 352 may be patterned to expose underlying conductive features, and have conductive features 354 formed over the exposed conductive features for electric connection. For example, a bottommost dielectric layer of the one or more dielectric layers 352 is patterned to expose the underlying contact die pattern 334, and some conductive features of the one or more conductive features 354 are formed in the bottommost dielectric layer of the one or more dielectric layers 352. The conductive feature 354 may comprise various lines/traces and/or vias.

Connectors 360 are formed on a top surface of the RDL 350. The connectors 360 provide electrical connections between external devices and the active and passive devices of the dies 330 (via the RDL 350, the contact die pattern 334, and the metallization layers of the dies 330). In some embodiments, the connectors 360 may comprise solder materials such as lead-based solders (e.g., PbSn), lead-free solders (e.g., InSb), tin, silver, and copper compositions, and other eutectic materials that have a suitable melting point and form conductive solder connections in electrical applications. In some embodiments, the connectors 360 may comprise conductive materials such as copper, tungsten, aluminum, silver, gold, the like, or a combination thereof, and may be formed using, an electro-chemical plating process, an electroless plating process, ALD, PVD, the like, or a combination thereof.

In some embodiments, a topmost dielectric layer of the RDL 350 is patterned to expose portions of the conductive features 354. The patterning may include suitable photolithography and etching processes. The connectors 360 may be formed on the exposed portions of the conductive features 354. Formation of the connectors 360 completes formation of semiconductor package devices 300. In the illustrated embodiments, each semiconductor package device 300 comprises the die 330 encapsulated by the first encapsulant 340, and the connectors 360.

Figure 9E:
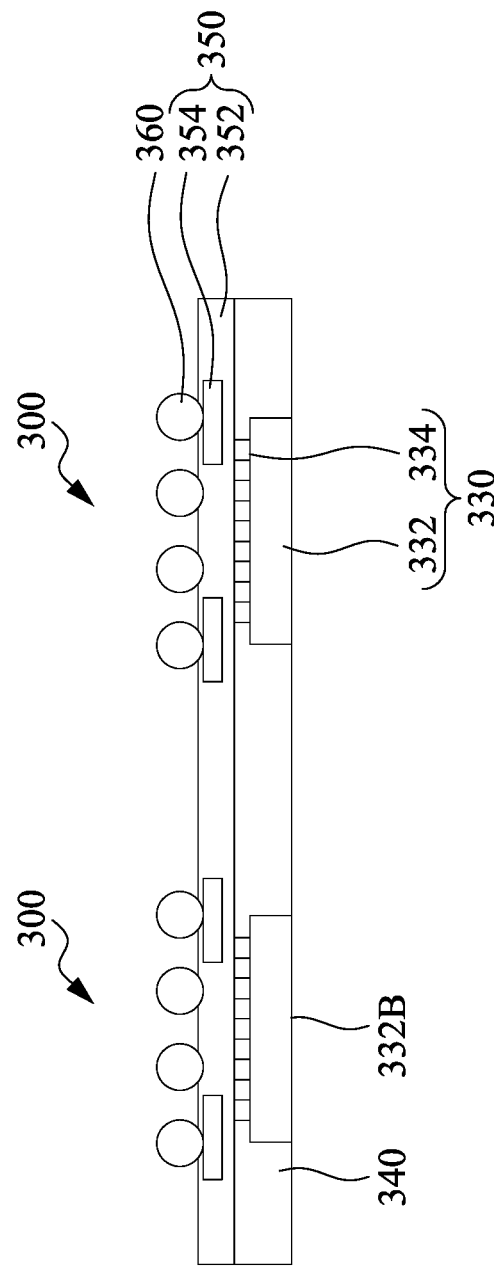

Referring to FIG. 9E, the adhesive layer 320 and the carrier 310 (referring to FIG. 9D) are removed from the backsides 332B of the dies 330 and the bottom surface of the first encapsulant 340. For example, UV radiation or heat of light is used to decompose the de-bonding layer of the adhesive layer 320, thereby releasing/debonding the carrier 310 (referring to FIG. 9D) (referring to FIG. 9D) from the backsides 332B of the dies 330.

Figure 9F:
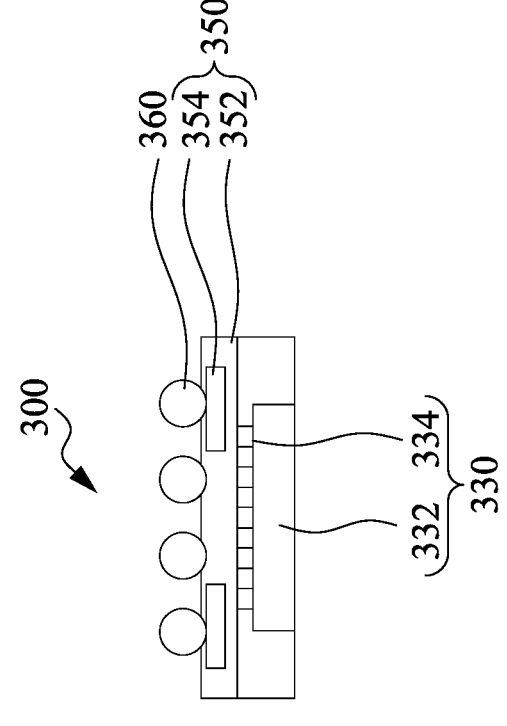
Figure 9F:
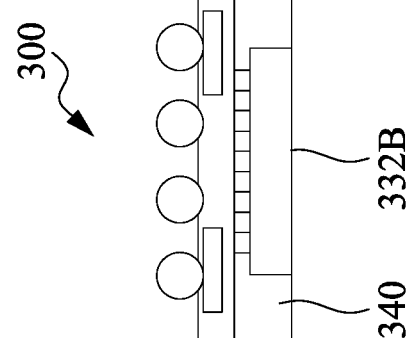

Referring to FIG. 9F, the semiconductor package devices 300 are singulated by sawing, laser ablation, or the like. In the illustrated embodiments, each of the semiconductor package devices 300 comprises a single die (such as the die 330). In other embodiments, each of the semiconductor package devices 300 may comprise any number of dies 330 depending on design specification of the semiconductor package devices 300.

Figure 9G:
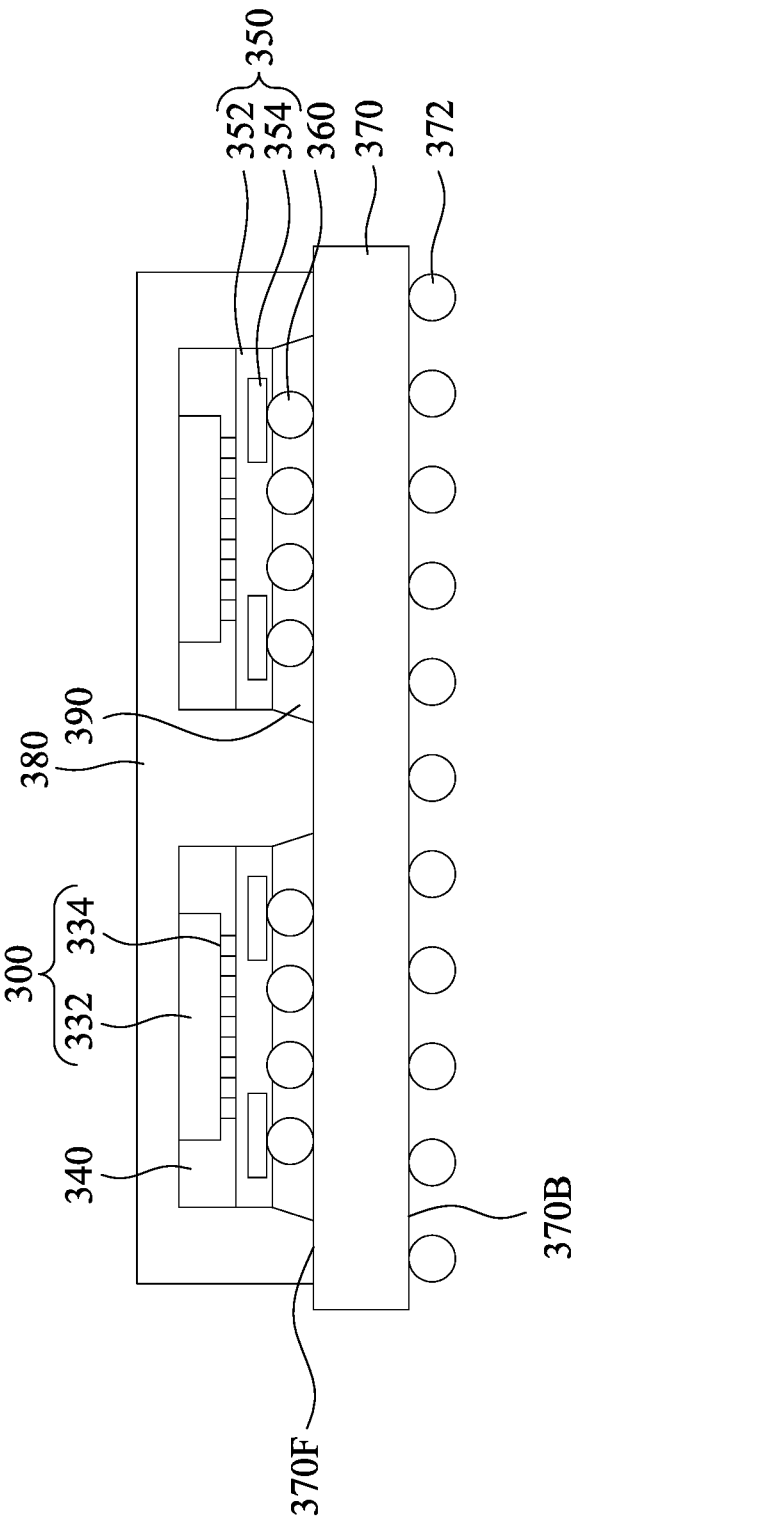

Referring to FIG. 9G, one or more semiconductor package devices 300 are attached to a front side 370F of a package substrate 370 using the connectors 360. A reflow process may be performed on the connectors 360 to bond the semiconductor package devices 300 to the package substrate 370.

The package substrate 370 may be a laminated substrate, a silicon interposer, a glass interposer, a printed circuit board (PCB), or the like. For example, the package substrate 370 may include a core and one or more build-up layers disposed on either side of the core. The build-up layers may be etched into traces of various widths and lengths and connected through inter-layer vias. Together, the traces/lines and vias may form an electrical network to route power, ground, and signals from the front side 370F of the package substrate 370 to a back side 370B of the package substrate 370. For example, the electrical network connects the connector 360 at the front side 370F to connectors 372 at the back side 370B. The package substrate 370 may be fabricated from, for example, silicon, an organic (laminate) material such as bismaleimide-triazine (BT), a polymer-based material such as liquid-crystal polymer (LCP), a ceramic material such as low-temperature co-fired ceramic (LTCC), or the like. The traces/lines and the vias of the package substrate 370 may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, CVD methods, or the like. In some embodiments, the package substrate 370 comprises electrical elements, such as resistors, capacitors, signal redistribution circuitry, combinations of these, or the like. These electrical elements may be active, passive, or a combination thereof. Materials and formation process of the connectors 372 may be similar to that of the connectors 360, and thereto not repeated herein.

In some embodiments, a second encapsulant 380 is formed over the package substrate 370 around the semiconductor package devices 300. The second encapsulant 380 may fill the spaces between the semiconductor package devices 300, and encapsulates the dies 330 and the first encapsulant 340 of the semiconductor package devices 300. The second encapsulant 380 may include aforementioned composite material fabricated through the premixing process. In some embodiments, a material of the second encapsulant 380 may be the same as or similar to the material of the first encapsulant 340. For example, the first and second encapsulants 340 and 380 may both includes CNF/h-BN, and have the same or different premixing weight ratios. In some alternative embodiments, the second encapsulant 380 may include a different 2D material from that of the first encapsulant 340. In some embodiments, a 2D material of the second encapsulant 380 may have a higher electrical conductivity than a 2D material of the first encapsulant 340. For example, the second encapsulant 380 includes CNF/graphene for providing thermal management and shielding effect for EMI protection, while the first encapsulant 340 includes CNF/h-BN for providing electrical isolation. For example, the second encapsulant 380 may be formed by premixing CNF and graphene to form a composite filler, and compounding a prepolymeric material with the composite filler, and curing the mixture.

In some embodiments, prior to the formation of the second encapsulant 380, a underfill 390 may be dispensed between the semiconductor package device 300 and the package substrate 370 around the connectors 360. The underfill 390 may include aforementioned composite material fabricated through the premixing process. In some embodiments, the underfill 390 may include materials providing electrical isolation, such as CNF/h-BN. In some embodiments, a material of the underfill 390 may be the same as or similar to the material of the first encapsulant 340. For example, the first encapsulant 340 and the underfill 390 may both includes CNF/h-BN, and have the same or different premixing weight ratios. Underfill may be formed by a capillary flow process after die bonding, or may be formed by a suitable deposition method before die bonding. In some embodiments, a curing process may be performed after a material of the underfill is dispensed to harden the material of the underfill.

FIGS. 10A-10I illustrate a method for fabricating a chip-on-wafer-on-substrate (CoWoS) package structure at various intermediate stages of manufacture according to some embodiments of the present disclosure. It is understood that additional steps may be provided before, during, and after the steps shown by FIGS. 10A-10I, and some of the steps described below can be replaced or eliminated for additional embodiments of the method. The order of the operations/processes may be interchangeable.

Figure 10A:
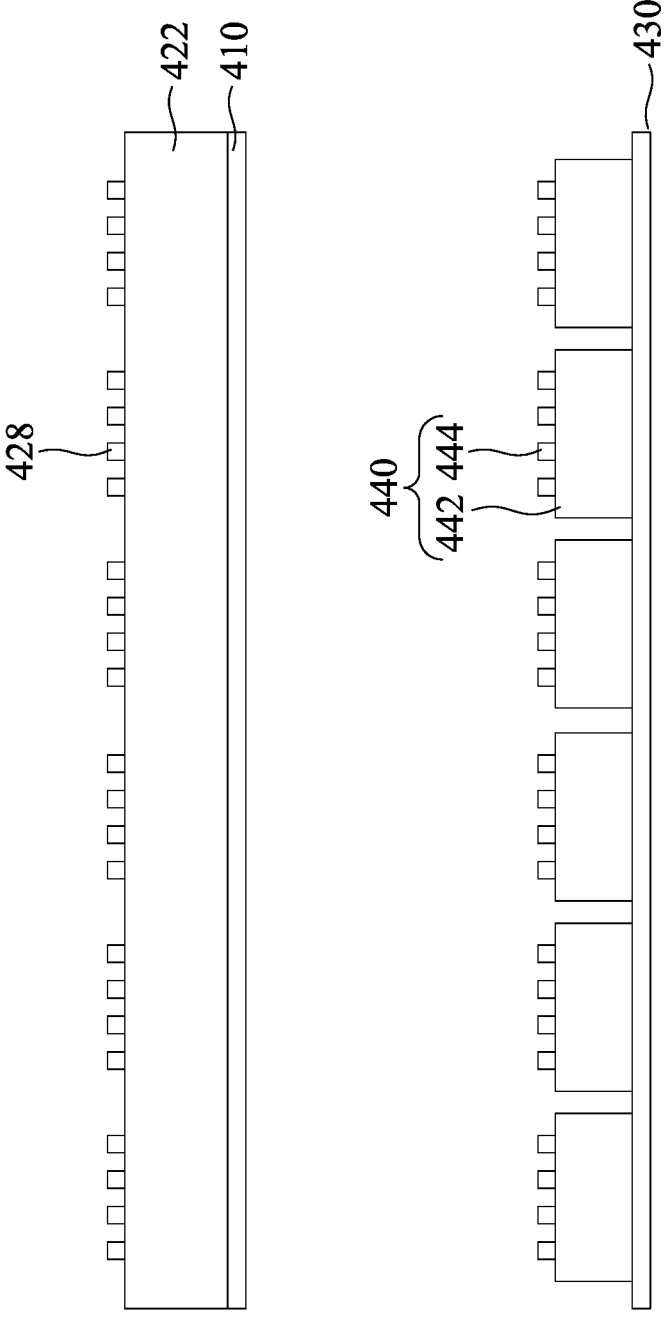
FIGS. 10A-10I illustrate a method for fabricating a chip-on-wafer-on-substrate (CoWoS) package structure at various intermediate stages of manufacture according to some embodiments of the present disclosure.

FIG. 10A illustrates a substrate 422 placed on a carrier 410. In some embodiments, an adhesive layer (now shown) may be used to attach the substrate 422 to the carrier 410. The adhesive layer (now shown) may include a die attach film, a de-bonding layer, any suitable adhesive, epoxy, wax, the like or the combination thereof. Details of the carrier 410 and the adhesive layer (now shown) may be similar to the carrier 310 and the adhesive layer 320 in FIG. 9A, and not repeated herein.

Substrate 422 may be an interposer. The substrate 422 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 422 may be a SOI substrate. Devices, such as transistors, capacitors, resistors, diodes, and the like, may be formed in and/or on a surface of substrate 422. Substrate 422 is, in one alternative embodiments, based on an insulating core such as a fiberglass reinforced resin core. One example core material is fiberglass resin. Alternatives for the core material include bismaleimide-triazine (BT) resin, or alternatively, other printed circuit board (PCB) materials or films.

Conductive through vias (e.g., through vias 422TV in FIG. 11) may be formed in the substrate 422. A RDL may be formed over substrate 422 and over the conductive through vias. Connectors 428 may be formed over a top surface of the RDL. Details of the RDL and the connectors 428 may be similar to that of the RDL 350 and the connectors 360 (referring to FIG. 9D), and therefore not repeated herein.

FIG. 10A further illustrates dies 440 placed on a carrier 430. Dies 440 may each include a main body 442 and connectors 444. Main body 442 may comprise any number of dies, substrates, transistors, active devices, passive devices, metallization layers, the like, and/or the combination thereof. Connectors 444 may be disposed on a top side of dies 440. Connectors 444 may be electrically connected to the metallization layers of the main body 442. Connectors 444 may be formed using methods that are the same or similar to the methods described above in connection with connectors 360.

Figure 10B:
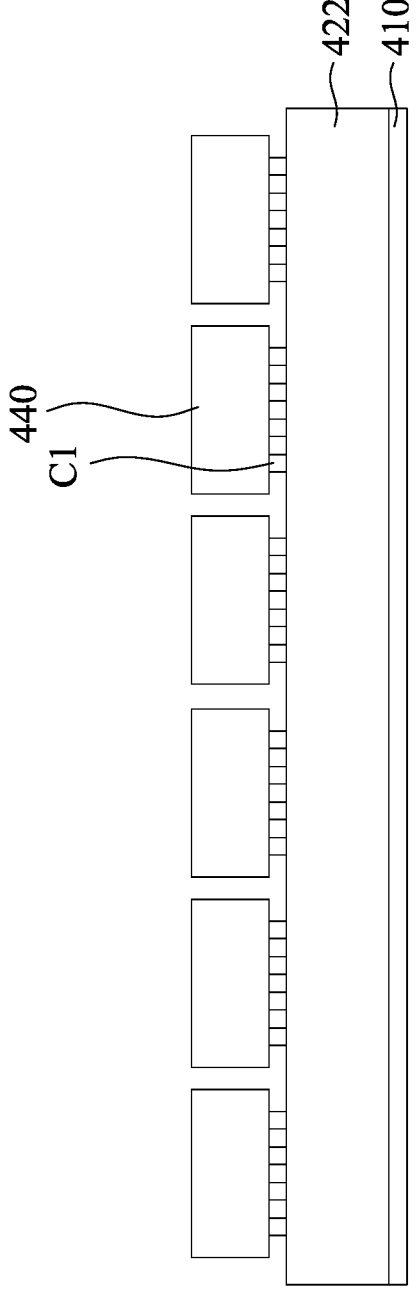

Reference is made to FIG. 10B, where the dies 440 are bonded to the substrate 422, for example, by bonding connectors 444 (referring to FIG. 10A) to connectors 428 (referring to FIG. 10A). The bonded dies 440 may have an identical structure and/or function, or may have different structures and functions. After the bonding process, the connectors 444 and 428 (referring to FIG. 10A) in combination are referred to as connector C1.

Figure 10C:
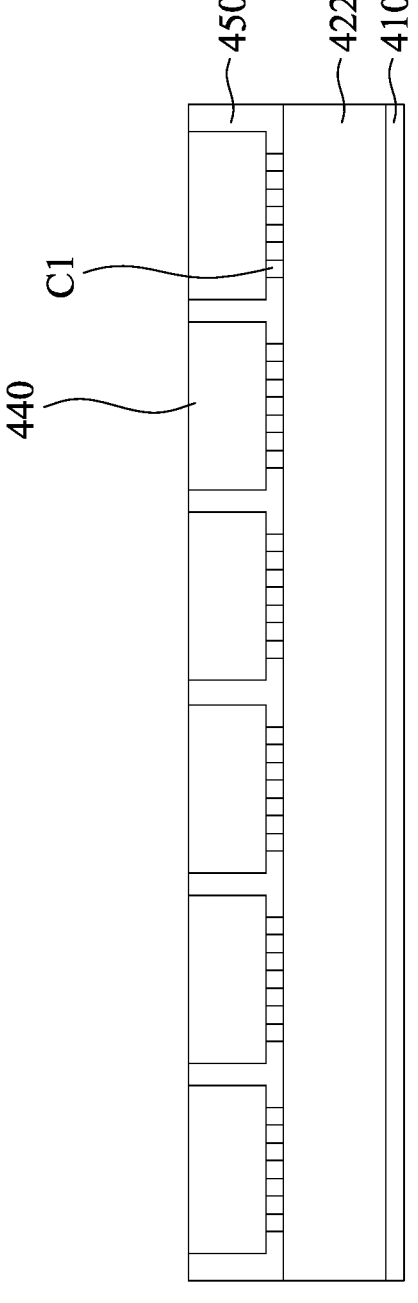

Reference is made to FIG. 10C, the dies 440 are encapsulated in an encapsulant 450. The encapsulant 450 may fill the gaps between dies 440, and may be in contact with the connectors C1. The encapsulant 450 may include aforementioned composite material 130' (referring to FIGS. 2F-3B) fabricated through the premixing process. The encapsulant 450 may provide thermal management and electrical insulation. For example, the encapsulant 450 is formed by premixing CNFs and h-BN to form a composite filler, compounding a prepolymeric material with the composite filler, and curing the mixture. Next, a grinding step is performed to thin the encapsulant 450, until top surfaces of the dies 440 are exposed. The resulting structure is shown in FIG. 10C.

In some embodiments, prior to the formation of the encapsulant 450, an underfill (not shown) may be formed between dies 440 and substrate 422 and may surround connectors C1. The underfill may include aforementioned composite material fabricated through the premixing process. In some embodiments, the underfill may include materials providing electrical isolation, such as CNF/h-BN. Underfill may be formed by a capillary flow process after die bonding, or may be formed by a suitable deposition method before die bonding. In some embodiments, a curing process may be performed after a material of the underfill is dispensed to harden the material of the underfill.

Figure 10D:
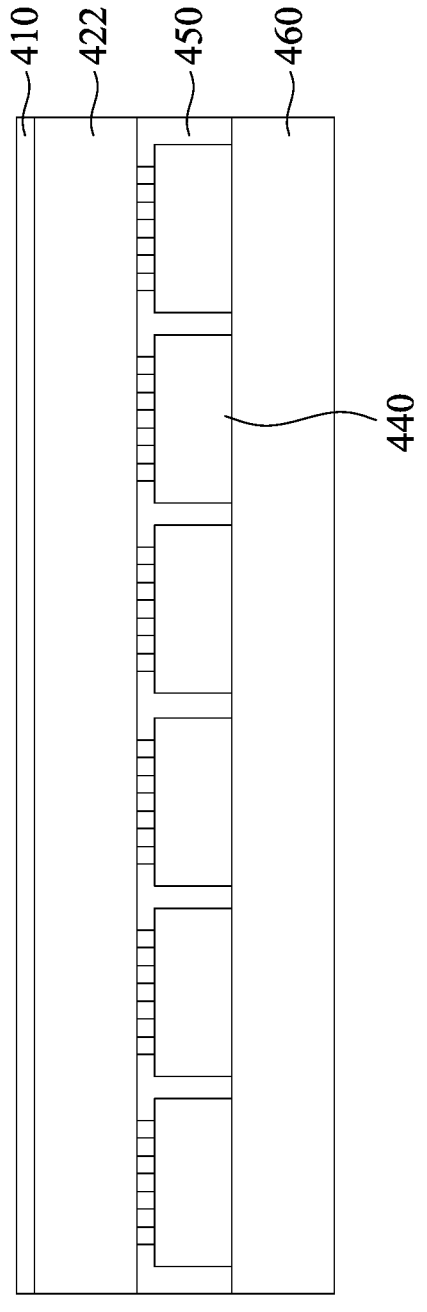

Reference is made to FIG. 10D, where a carrier 460 is attached to surfaces of dies 440 that are exposed by the encapsulant 450. The carrier 460 may be attached using suitable adhesive layers, such as a die attach film, a debonding layer, any suitable adhesive, epoxy, wax, the like or the combination thereof. The carrier 460 may provide structural support to the dies 440 and the encapsulant 450. Details of the carrier 460 and the adhesive layer may be similar to the carrier 310 and the adhesive layer 320 in FIG. 9A, and not repeated herein.

Figure 10E:
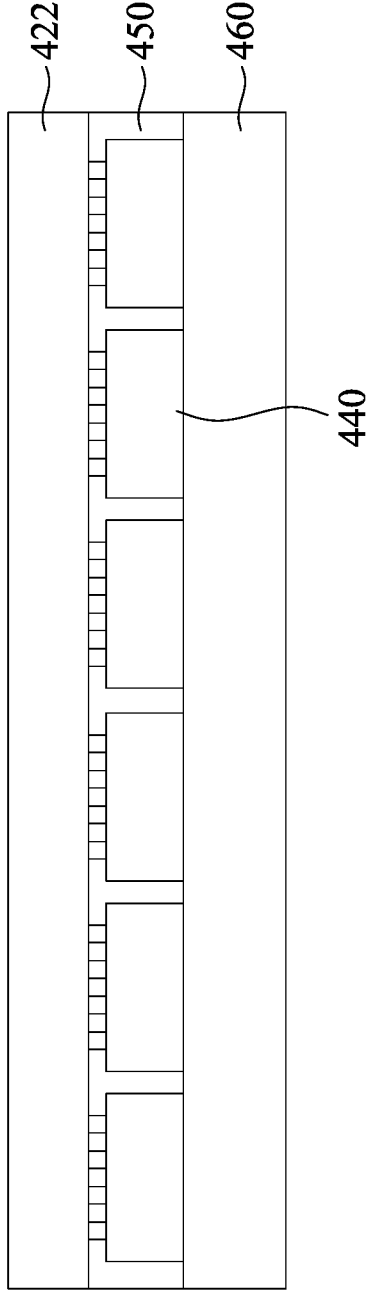

Reference is made to FIG. 10E, the carrier 410 (referring to FIG. 10D) is debonded from the substrate 422. The debonding process may uses UV radiation or heat of light is used to decompose the de-bonding layer of the adhesive layer, thereby releasing the carrier 410 (referring to FIG. 10D) from the substrate 422. After the debonding process, the substrate 422 may then be thinned using a grinding process.

Figure 10F:
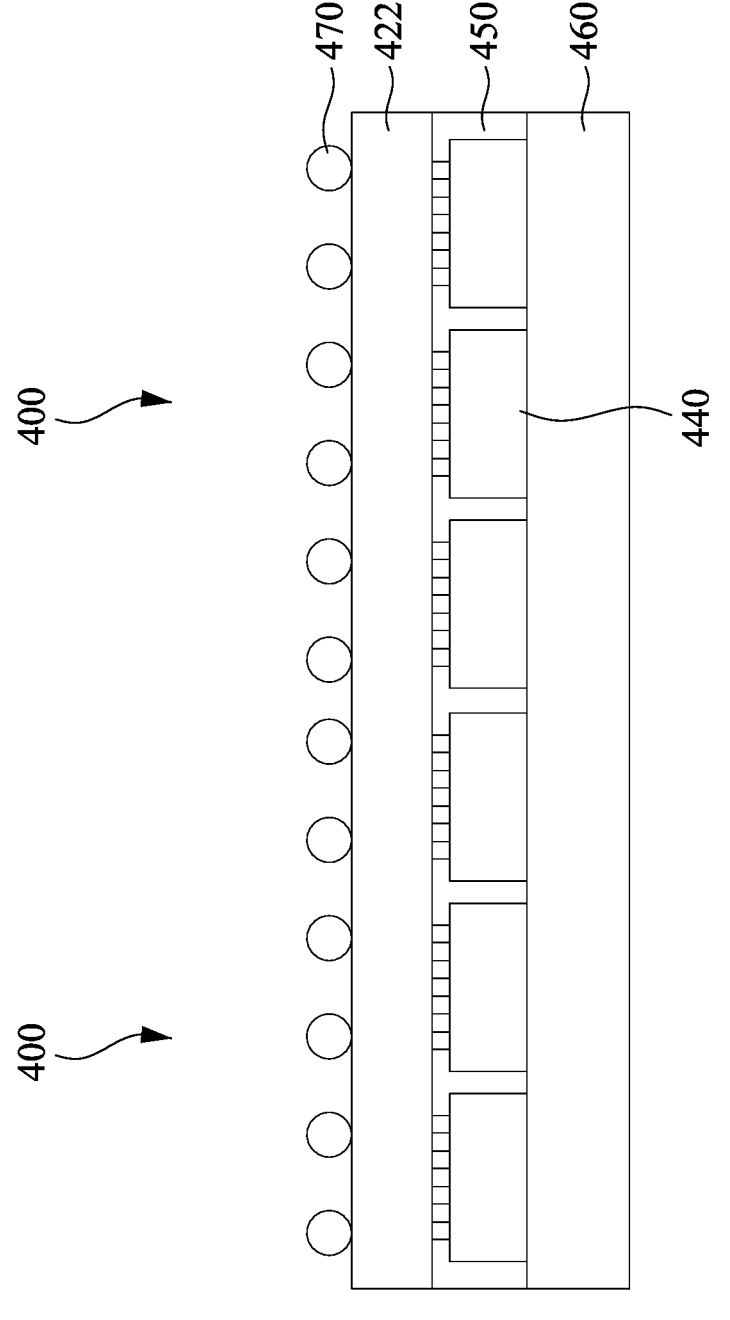

Reference is made to FIG. 10F, connectors 470 are formed on the substrate 422 using the same or similar methods described above in connection with connectors 360. Formation of the connectors 470 completes formation of semiconductor package devices 400. In the illustrated embodiments, each semiconductor package device 400 may comprise three dies 440 encapsulated by the encapsulant 450 and bonded to the substrate 422.

Figure 10G:
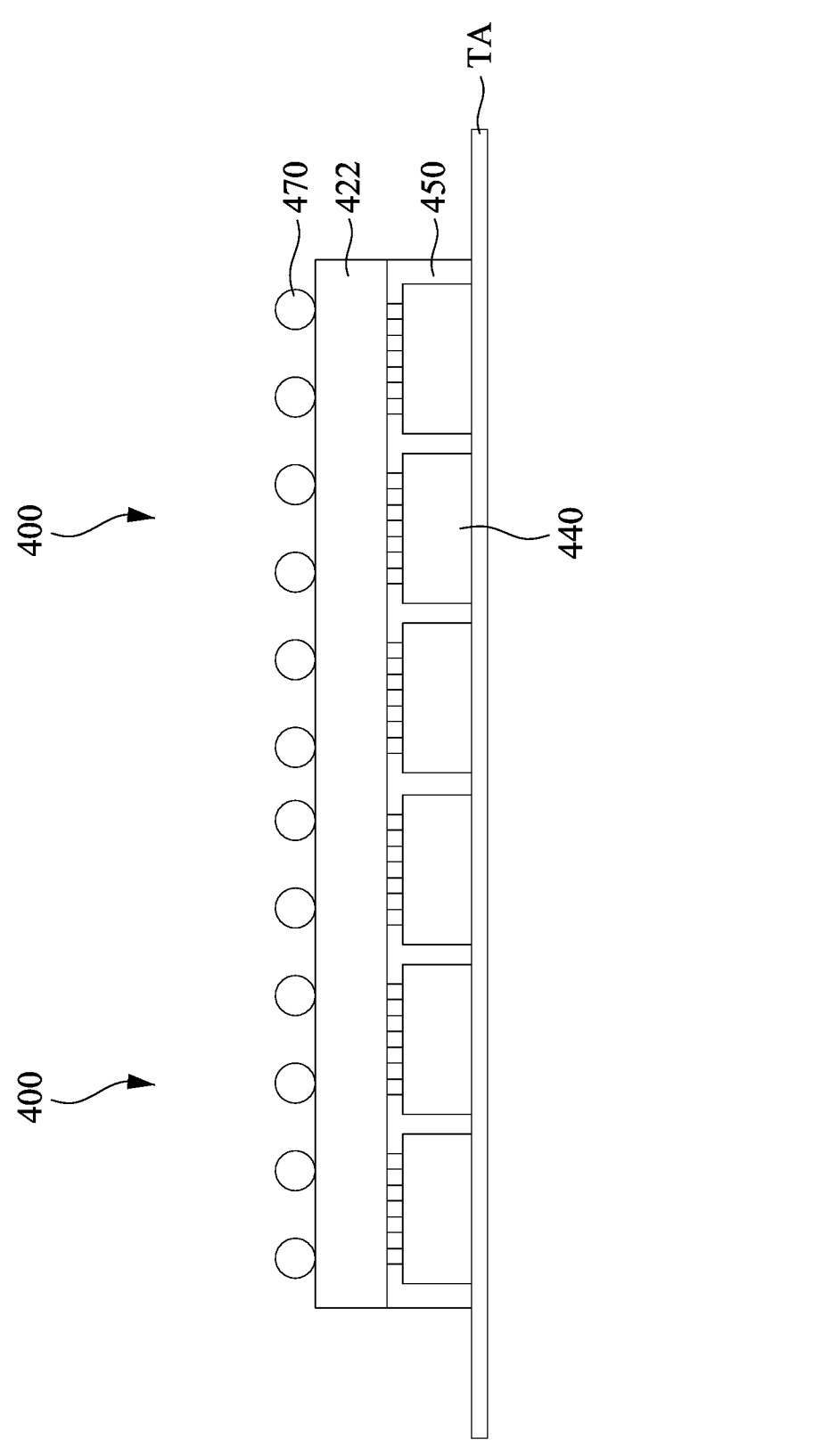

Reference is made to FIG. 10G, where the carrier 460 (referring to FIG. 10F) is debonded from the dies 440. The debonding process may uses UV radiation or heat of light is used to decompose the de-bonding layer of the adhesive layer, thereby releasing the carrier 460 (referring to FIG. 10F) from the dies 440. After the debonding process, the dies 440 may be attached to a temporary support tap TA.

Figure 10H:
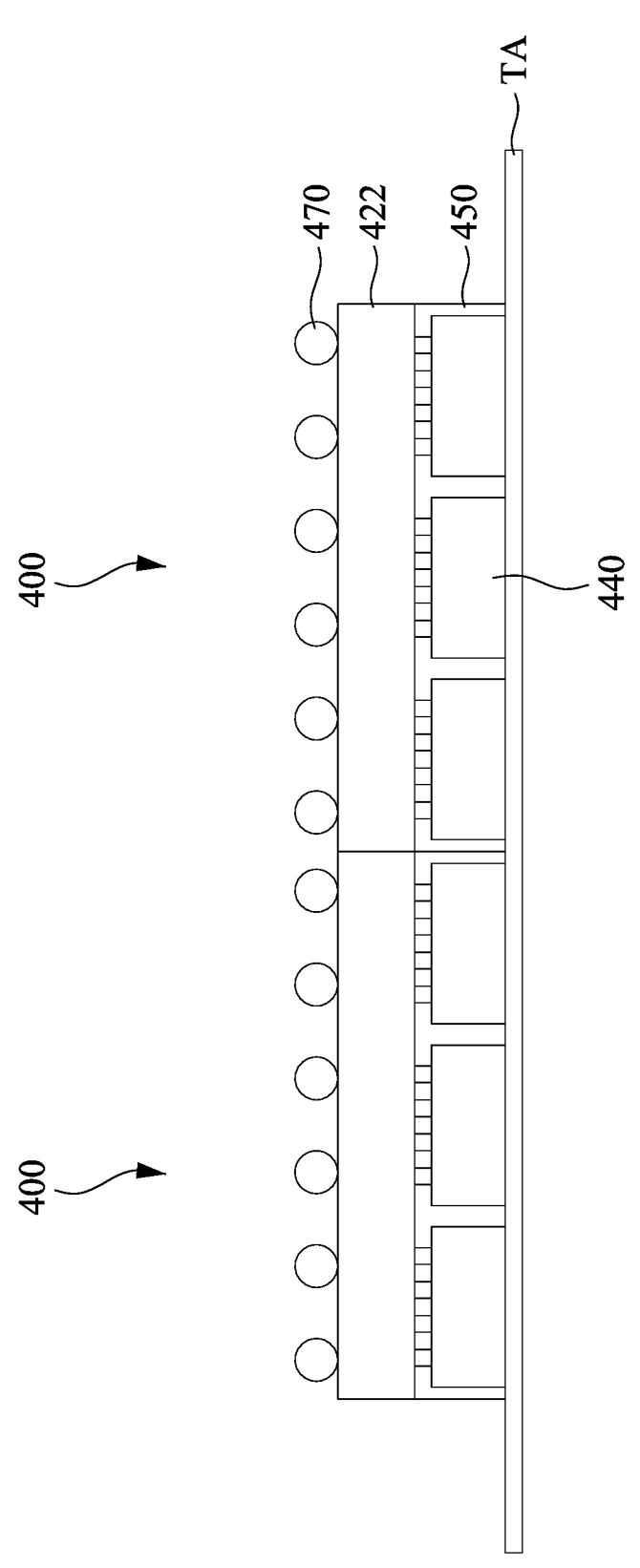

Reference is made to FIG. 10H, where the semiconductor package devices 400 are singulated by sawing, laser ablation, or the like. After singulation, the semiconductor package devices 400 are separated from each other. In the illustrated embodiments, each of the semiconductor package devices 400 comprises three dies 440 bonding to a single substrate (or interposer) 422. In other embodiments, different numbers and/or configurations of dies 440 may be used for each semiconductor package devices 400.

Figure 10I:
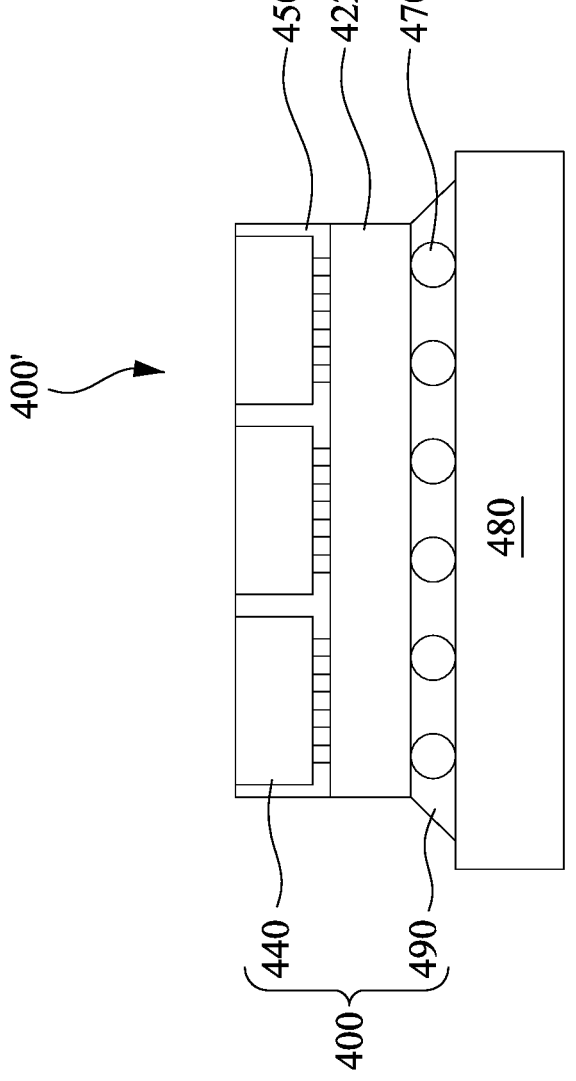

Reference is made to FIG. 10I, a semiconductor package device 400 is bonding to a package substrate 480, thereby forming a CoWoS semiconductor package device 400'. The package substrate 480 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 480 may be a SOI substrate. The package substrate 480 is, in one alternative embodiments, based on an insulating core such as a fiberglass reinforced resin core. One example core material is fiberglass resin. Alternatives for the core material include bismaleimide-triazine (BT) resin, or alternatively, other printed circuit board (PCB) materials or films.

The package substrate 480 may include active and passive devices. Transistors, capacitors, resistors, combinations of these, and the like may be used to generate the structural and functional requirements of the design for the semiconductor package. The devices may be formed using any suitable methods. The package substrate 480 may also include metallization layers and vias (e.g., the metallization pattern 480M in FIG. 11) and bond pads connected to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 480 is substantially free of active and passive devices.

In some embodiments, a underfill 490 may be dispensed between the semiconductor package device 400 and the package substrate 480 around the connectors 470. The underfill 490 may include aforementioned composite material fabricated through the premixing process. In some embodiments, the underfill 490 may include materials providing electrical isolation, such as CNF/h-BN. In some embodiments, the underfill 490 may include the same material as that the encapsulant 450. Underfill may be formed by a capillary flow process after bonding, or may be formed by a suitable deposition method before bonding. In some embodiments, a curing process may be performed after a material of the underfill is dispensed to harden the material of the underfill.

Figure 11:
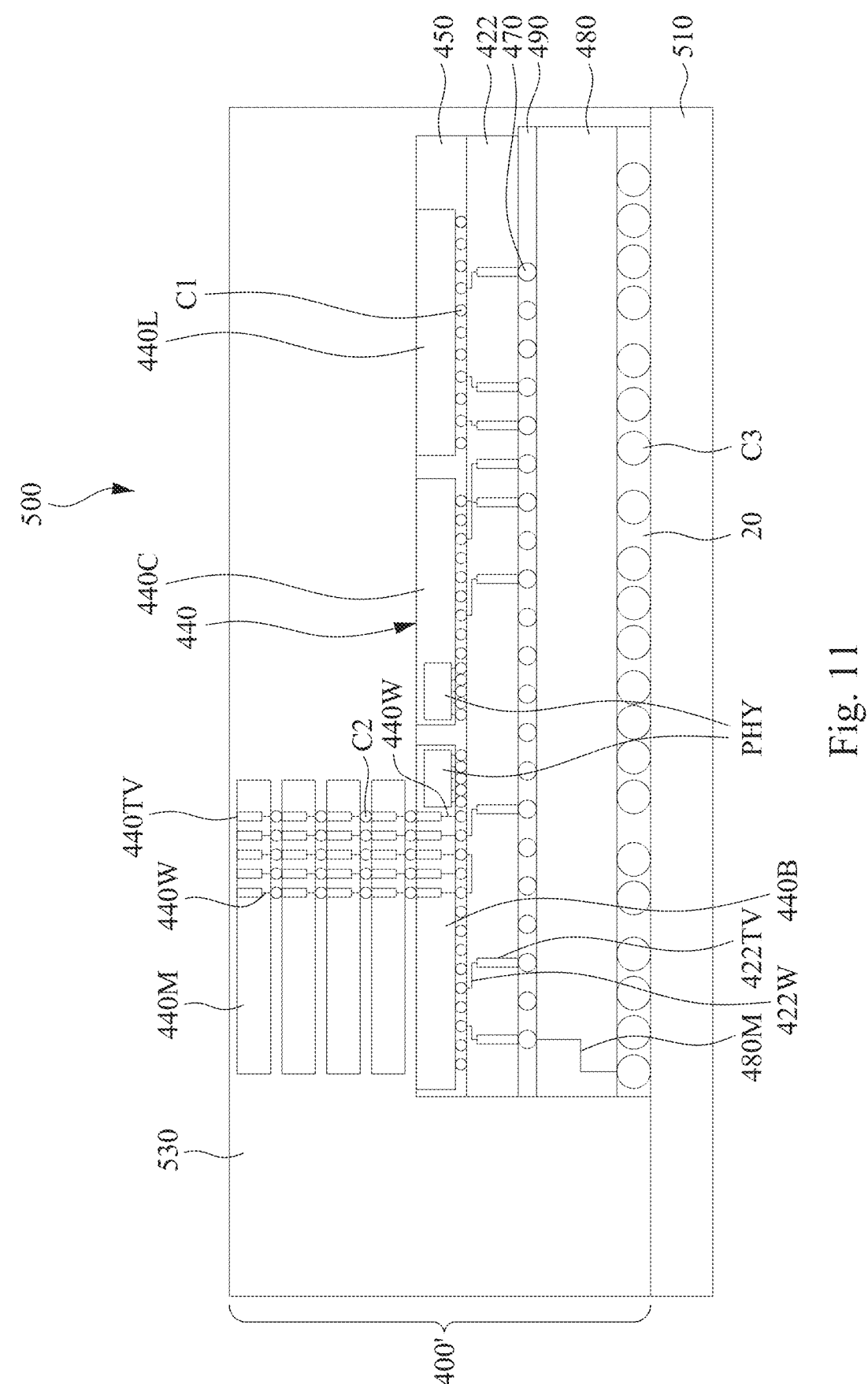
FIG. 11 shows a CoWoS package structure according to some embodiments of the present disclosure.

FIG. 11 shows a package structure 500 according to some embodiments of the present disclosure. The package structure 500 may include a CoWoS semiconductor package device 400', a circuit board 510, and an encapsulant 530. The CoWoS semiconductor package device 400' may include various dies 440, an interposer 422, a package substrate 480, an encapsulant 450, and a underfill 490, as illustrated in FIGS. 10A-10I. The CoWoS semiconductor package device 400' is bonded to the circuit board 510 through the connectors C3. Before or after the bonding process, the CoWoS semiconductor package device 400' may be encapsulated in the encapsulant 530. The encapsulant 530 may include aforementioned composite material 130' (referring to FIGS. 2F-3B) fabricated through the premixing process. For example, the encapsulant 530 is formed by premixing CNFs and h-BN to form a composite filler, compounding a prepolymeric material with the composite filler, and curing the mixture.

In some embodiments, the package structure 500 may further include an underfill 520 between the CoWoS semiconductor package device 400' and the circuit board 510 and around the connectors C3. The underfill 520 may include aforementioned composite material fabricated through the premixing process. In some embodiments, the underfill 520 may include materials providing electrical isolation, such as CNF/h-BN. Underfill may be formed by a capillary flow process after bonding, or may be formed by a suitable deposition method before bonding. In some embodiments, a curing process may be performed after a material of the underfill is dispensed to harden the material of the underfill.

In some embodiments, depending on the requirements of mechanical support and electrical insulation, the encapsulant 530, the underfill 520, and the encapsulant 450 and the underfill 490 of the CoWoS semiconductor package device 400' may be designed to have the same 2D material and the same or different the premixing weight ratios of CNF/h-BN. In some alternative embodiments, the encapsulant 530 may include a different 2D material from that of the underfill 520, the encapsulant 450, and the underfill 490. In some embodiments, a 2D material of the encapsulant 450 may have a higher electrical conductivity than a 2D material of the underfill 520, the encapsulant 450, and the underfill 490. For example, the encapsulant 530 includes CNF/graphene for providing thermal management and shielding effect for ESD and EMI protection, while the underfill 520, the encapsulant 450, and the underfill 490 include CNF/h-BN for providing electrical isolation. For example, the encapsulant 530 may be formed by premixing CNF and graphene to form a composite filler, compounding a prepolymeric material with the composite filler, and curing the mixture.

In some embodiments, thee dies 440 may be bonded to interposer 422 through the connectors C1. The die 440 may include conductive through vias 440TV extending through the main body of the die 440. The die 440 may further include conductive wires 440W in the RDL thereof, and the conductive wires 440W may connect the conductive through vias 440TV to the connectors C1/C2. The interposer 422 may include conductive through vias 422TV extending through the interposer 422. A RDL may be formed over interposer 422 and over the conductive through vias 422TV. The RDL may include conductive wires 422W connecting the conductive through vias 422TV to the connectors C1. The connectors 470 may connect the conductive through vias 422TV of the interposer 422 to a metallization pattern 480M of the package substrate 480. The connectors C3 may connect the metallization pattern 480M of the package substrate 480 to the circuit board 510. Through these connections, the dies 440 of the CoWoS semiconductor package device 400' can be electrically coupled to the circuit board 510.

In accordance with some exemplary embodiments, the dies 440 may include dies 440L, 440C, 440B, 440M. The die 440C may be a compute die, such as Central Processing Units (CPUs), Application processors (APs), system on chips (SOCs), Application Specific Integrated Circuits (ASICs), or the like. In accordance with some exemplary embodiments, the dies 440M comprise memory dies. The dies 440M may be Dynamic Random Access Memory (DRAM) dies, Static Random Access Memory (SRAM) dies, High-Bandwidth Memory (HBM) dies, Micro-Electro-Mechanical System (MEMS) dies, Hybrid Memory Cube (HMC) dies, or the like. The die 440L may be a logic die. The die 440B may be a basic die where the memory dies 440M are stacked and bonded by connectors C2. The logic or base die is relatively simple and is built in a CMOS compute process to enable the efficient construction of drivers and of a small amount of logic to interface between the stack of memory dies 440M and the compute die 440C. Although four kinds of dies 440 are illustrated, fewer or more kinds of dies 440 may be used. The dies 440 may have an identical structure and/or identical functions, or may have different structures and functions. Some dies 440 (e.g., dies 440C and 440B) may include a physical layer/chip PHY which is closely associated with the physical connection between devices. Other details of the present embodiments are similar to those illustrated in 10A-10I, and thereto not repeated herein.

Based on the above discussions, it can be seen that the present disclosure offers advantages to the package structure. It is understood, however, that other embodiments may offer additional advantages, and not all advantages are necessarily disclosed herein, and that no particular advantage is required for all embodiments. One advantage is that by premixing CNFs and a thermally conductive 2D material to form a composite filler, a thermally conductive network can be created in a composite material, thereby improving the thermal conduction of the composite material. Another advantage is that by introducing suitable mixing ratios (e.g., the premixing weight ratio and the filler weight ratio in the polymeric material), the 2D materials can be blended uniformly in the polymeric material and successfully make the composite material retain the good properties from the 2D materials. Still another advantage is that that the composite material may use various 2D material for different applications, for example, the composite material using h-BN features good dielectric properties (e.g., low dielectric constant and low loss tangent) for electrical isolation, and the composite material using graphene features shielding effect. Still another advantage is that the composite material shows good passivation properties, light weight, and low cost. Still another advantage is that the composite material is renewable and replenishable materials from earth crust, meeting the green electronics standard. Still another advantage is that the formation approaches of the composite material are verified with the industrial compatible equipment and electronic devices.

According to some embodiments of the present disclosure, a method for fabricating a package structure is provided. The method includes premixing cellulose nanofibrils (CNFs) and a two-dimensional (2D) material in a solvent to form a solution; removing the solvent from the solution to form a composite filler; mixing a prepolymeric material with the composite filler to form a composite material; and performing a molding process using the composite material.

According to some embodiments of the present disclosure, a method for fabricating a package structure is provided. The method includes premixing a 1D nanomaterial and a 2D material in a solution, wherein the 1D nanomaterial has a higher length-to-width ratio than the 2D material; drying the solution to form a composite filler; melt-mixing a prepolymeric material with the composite filler to form a composite material; and encapsulating a die using the composite material.

According to some embodiments of the present disclosure, a package structure includes a die and a first encapsulant around the die. The first encapsulant includes a first polymeric material and a first material network in the first polymeric material. The first material network comprises first CNFs and a first 2D material, and the first 2D material has an in-plane thermal conductivity greater than a thermal conductivity of the first polymeric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a package structure, comprising:

premixing cellulose nanofibrils (CNFs) as a first one-dimensional (1D) nanomaterial and a first two-dimensional (2D) material in a solvent to form a first solution, wherein a weight of the CNFs to a weight of the first 2D material define a first premixing weight ratio;

removing the solvent from the first solution to form a first composite filler;

mixing a first prepolymeric material with the first composite filler to form a first composite material;

dispensing the first composite material between a package substrate and a semiconductor package device disposed over the package substrate;

premixing a second 1D nanomaterial and a second 2D material in a second solution, such that a second premixing weight ratio of a weight of the second 1D nanomaterial to a weight of the second 2D material is different than the first premixing weight ratio of the weight of the CNFs to the weight of the first 2D material;

drying the second solution to form a second composite filler;

melt-mixing a second prepolymeric material with the second composite filler to form a second composite material; and dispensing the second composite material over the semiconductor package device and the package substrate, wherein the second 2D material comprises hexagonal boron nitride.

2. The method of claim 1, wherein mixing the first prepolymeric material with the first composite filler further comprises:

melting the first prepolymeric material to mix the melted first prepolymeric material and the first composite filler.

3. The method of claim 1, wherein removing the solvent from the first solution comprises:

evaporating the solvent.

4. The method of claim 1, wherein removing the solvent from the first solution is performed such that the first composite filler is in solid form.

5. The method of claim 1, further comprising: before dispensing the first composite material between the package substrate and the semiconductor package device, encapsulating a die in the semiconductor package device using a third composite material, the third composite material comprising a third prepolymeric material and a third composite filler, the third composite filler being prepared from a third solution comprising a third 1D nanomaterial and a third 2D material.

6. The method of claim 1, wherein dispensing the first composite material between the package substrate and the semiconductor package device is performed such that the CNFs and the first 2D material form a network in the first composite material.

7. The method of claim 1, wherein dispensing the first composite material between the package substrate and the semiconductor package device is performed such that the first prepolymeric material is cured to be a polymeric material, and the first 2D material has an in-plane thermal conductivity greater than a thermal conductivity of the polymeric material.

8. The method of claim 1, wherein dispensing the first composite material between the package substrate and the semiconductor package device is performed such that the first prepolymeric material is cured to be a polymeric material, and the first 2D material has an out-of-plane thermal conductivity greater than a thermal conductivity of the polymeric material.

9. The method of claim 1, wherein the first 2D material comprises graphene.

10. A method for fabricating a package structure, comprising:

premixing a first one-dimensional (1D) nanomaterial and a first 2D material in a first solution, wherein the first 1D nanomaterial has a higher length-to-width ratio than the first 2D material, such that a first premixing weight ratio of a weight of the first 1D nanomaterial to a weight of the first 2D material is in a range from about 10% to about 90%;

drying the first solution to form a first composite filler;

melt-mixing a first prepolymeric material with the first composite filler to form a first composite material;

encapsulating a die using the first composite material;

attaching the die to a package substrate;

premixing a second 1D nanomaterial and a second 2D material in a second solution, such that a second premixing weight ratio of a weight of the second 1D nanomaterial to a weight of the second 2D material is different than the first premixing weight ratio of the weight of the first 1D nanomaterial to the weight of the first 2D material;

drying the second solution to form a second composite filler;

melt-mixing a second prepolymeric material with the second composite filler to form a second composite material comprising the second prepolymeric material and the second composite filler; and dispensing the second composite material between the die and the package substrate.

11. The method of claim 10, further comprising:

pulverizing the first composite filler prior to melt-mixing the first prepolymeric material with the first composite filler.

12. The method of claim 10, wherein, melt-mixing the first prepolymeric material with the first composite filler is performed such that a ratio of a weight of the first composite filler to a weight of the first composite material is in a range from about 10% to about 85%.

13. There method of claim 10, wherein the first 1D nanomaterial comprises cellulose nanofibrils.

14. The method of claim 10, wherein the second composite material has a higher electrical conductivity than the first composite material.

15. The method of claim 10, wherein the first 2D material comprises hexagonal boron nitride, and the second 2D material comprises graphene.

16. A method for fabricating a package structure, comprising:

premixing carbon nanotubes and a hexagonal boron nitride in a first solvent to form a first solution, wherein a weight of the carbon nanotubes to a weight of the hexagonal boron nitride define a first premixing weight ratio;

removing the first solvent from the first solution to form a first composite filler;

pulverizing the first composite filler;

mixing a first prepolymeric material with the first pulverized composite filler to form a first composite material;

encapsulating a die using the first composite material, the first composite material comprising the carbon nanotubes and the hexagonal boron nitride;

attaching the die to a package substrate;

premixing a 1D nanomaterial and graphene in a second solvent to form a second solution, wherein a weight of the 1D nanomaterial to a weight of the graphene define a second premixing weight ratio different than the first premixing weight ratio of the weight of the carbon nanotubes to the weight of the hexagonal boron nitride;

removing the second solvent from the second solution to form a second composite filler;

pulverizing the second composite filler;

mixing a second prepolymeric material with the pulverized composite filler to form a second composite material; and depositing the second composite material comprising the 1D nanomaterial and the graphene over the package substrate and the die.

17. The method of claim 16, wherein removing the first solvent from the first solution comprises:

evaporating the first solvent.

18. The method of claim 16, wherein removing the first solvent from the first solution is performed such that the first composite filler is in solid form.

19. The method of claim 16, wherein after depositing the second composite material, the second prepolymeric material is cured to be a polymeric material, and the graphene has an in-plane thermal conductivity greater than a thermal conductivity of the polymeric material.

20. The method of claim 16, wherein the 1D nanomaterial and the graphene form a network in the second composite material.

* * * * *